US006812276B2

(12) United States Patent
Yeager

(10) Patent No.: US 6,812,276 B2
(45) Date of Patent: Nov. 2, 2004

(54) POLY(ARYLENE ETHER)-CONTAINING THERMOSET COMPOSITION, METHOD FOR THE PREPARATION THEREOF, AND ARTICLES DERIVED THEREFROM

(75) Inventor: Gary William Yeager, Rexford, NY (US)

(73) Assignee: General Electric Company, Pittsfield, MA (US)

( * ) Notice: Subject to any disclaimer, the term of this patent is extended or adjusted under 35 U.S.C. 154(b) by 63 days.

(21) Appl. No.: 10/188,181

(22) Filed: Jul. 2, 2002

(65) Prior Publication Data

US 2003/0096123 A1 May 22, 2003

Related U.S. Application Data

(63) Continuation-in-part of application No. 09/682,057, filed on Jul. 16, 2001, now Pat. No. 6,627,704, and a continuation-in-part of application No. 09/452,733, filed on Dec. 1, 1999, now Pat. No. 6,352,782.
(60) Provisional application No. 60/262,571, filed on Jan. 18, 2001.

(51) Int. Cl.$^7$ .................................................. C08K 3/04
(52) U.S. Cl. ..................... 524/495; 524/611; 525/391; 528/205
(58) Field of Search .................. 525/391; 528/205; 524/495, 611

(56) References Cited

U.S. PATENT DOCUMENTS

| 3,306,875 A | 2/1967 | Hay |
| 3,356,761 A | 12/1967 | Fox |
| 3,375,228 A | 3/1968 | Holoch et al. |
| 3,557,045 A | 1/1971 | Wright et al. |
| 3,597,216 A | 8/1971 | Berardinelli et al. |
| 3,637,578 A | 1/1972 | Wright et al. |
| 3,883,612 A | 5/1975 | Pratt et al. |
| 3,936,414 A | 2/1976 | Wright et al. |
| 4,048,143 A | 9/1977 | Hay et al. |
| 4,148,843 A | 4/1979 | Goossens |
| 4,327,013 A | 4/1982 | Peters |
| 4,521,491 A | 6/1985 | Oizumi et al. |
| 4,562,243 A | 12/1985 | Percec |
| 4,565,684 A | 1/1986 | Tibbetts et al. |
| 4,572,813 A | 2/1986 | Arakawa |
| 4,604,417 A | 8/1986 | Cottman |
| 4,618,703 A | 10/1986 | Thanawalla et al. |
| 4,634,742 A | 1/1987 | Percec |
| 4,663,230 A | 5/1987 | Tennent |
| 4,663,402 A | 5/1987 | Percec et al. |
| 4,665,137 A | 5/1987 | Percec |
| 4,677,185 A | 6/1987 | Heitz et al. |
| 4,701,514 A | 10/1987 | Percec |
| 4,760,118 A | 7/1988 | White et al. |
| H521 H | 9/1988 | Fan |
| 4,806,601 A | 2/1989 | Percec |
| 4,816,515 A | 3/1989 | Weiss |
| 4,871,816 A | 10/1989 | Percec et al. |
| 4,874,826 A | 10/1989 | Sakamoto et al. |
| 4,888,397 A | 12/1989 | Van der Meer et al. |
| 4,923,932 A | 5/1990 | Katayose et al. |
| 5,039,781 A | 8/1991 | Neugebauer et al. |
| 5,061,602 A | 10/1991 | Koch et al. |
| 5,071,922 A | 12/1991 | Nelissen et al. |
| 5,079,268 A | 1/1992 | Nelissen et al. |
| 5,091,480 A | 2/1992 | Percec |
| 5,171,761 A | 12/1992 | Penco et al. |
| 5,213,886 A | 5/1993 | Chao et al. |
| 5,218,030 A | 6/1993 | Katayose et al. |
| 5,219,951 A | 6/1993 | Nelissen et al. |
| 5,304,600 A | 4/1994 | Nelissen et al. |
| 5,310,820 A | 5/1994 | Nelissen et al. |
| 5,338,796 A | 8/1994 | Vianello et al. |
| 5,352,745 A | 10/1994 | Katayose et al. |
| 5,407,972 A | 4/1995 | Smith et al. |
| 5,612,425 A | 3/1997 | Weber et al. |
| 5,834,565 A | 11/1998 | Tracy et al. |
| 5,851,646 A | 12/1998 | Takahashi et al. |
| 5,965,663 A | 10/1999 | Hayase |
| 6,022,550 A | 2/2000 | Watanabe |
| 6,306,963 B1 | 10/2001 | Lane et al. |
| 6,352,782 B2 | 3/2002 | Yeager et al. |
| 6,384,176 B1 | 5/2002 | Braat et al. |
| 2001/0053820 A1 | 12/2001 | Yeager et al. |
| 2002/0028337 A1 | 3/2002 | Yeager et al. |
| 2002/0077447 A1 | 6/2002 | Hwang et al. |

FOREIGN PATENT DOCUMENTS

| DE | 31 17 514 A1 | 5/1981 |
| DE | 41 03 140 A1 | 2/1991 |
| EP | 0 135 124 A2 | 8/1984 |
| EP | 0 206 072 B2 | 6/1986 |
| EP | 261 574 B1 | 9/1987 |
| EP | 385 065 A1 | 1/1990 |
| EP | 498 088 A1 | 12/1991 |
| NL | 8902092 | 8/1989 |

OTHER PUBLICATIONS

U.S. patent application Ser. No. 09/683,214, Yeager et al., filed Dec. 3, 2001.
U.S. patent application Ser. No. 09/683,352, Braat et al., filed Dec. 18, 2001.
U.S. patent application Ser. No. 09/681,376, Zarnoch et al., filed Mar. 27, 2001.
U.S. patent application Ser. No. 09/681,381, Teutsch et al., filed Mar. 27, 2001.
U.S. patent application Ser. No. 09/765,065, Zarnoch et al., filed Jan. 17, 2001.
U.S. patent application Ser. No. 10/119,406, Yeager et al., filed Apr. 9, 2002.
U.S. patent application Ser. No. 10/063,152, Braat et al., filed Mar. 26, 2002.
U.S. patent application Ser. No. 10/063,292, Merfeld et al., filed Apr. 9, 2002.
Derwent Abstract for JP 08–245872.
C. Pugh and V. Percec, Polym. Prepr. (Am. Chem. Soc., Div. Polym. Chem.) (1985), vol. 26, No. 2, pp. 303–305.

*Primary Examiner*—Patricia A. Short

(57) ABSTRACT

A thermosetting composition comprises a capped poly (arylene ether), an alkenyl aromatic monomer, and an alkoxylated acryloyl monomer. The composition provides good flow properties and fast curing rates. After curing, the composition exhibits good stiffness, toughness, and heat resistance.

34 Claims, No Drawings

POLY(ARYLENE ETHER)-CONTAINING THERMOSET COMPOSITION, METHOD FOR THE PREPARATION THEREOF, AND ARTICLES DERIVED THEREFROM

CROSS REFERENCE TO RELATED APPLICATIONS

This application is a continuation in part of U.S. application Ser. No. 09/682,057 filed 16 Jul. 2001, now U.S. Pat. No. 6,627,704 which claims the benefit of U.S. Provisional Application Ser. No. 60/262,571 filed 18 Jan. 2001 and is a continuation-in-part of U.S. application Ser. No. 09/452,733 filed 1 Dec. 1999, now U.S. Pat. No. 6,352,782, which are incorporated herein by reference.

BACKGROUND

Thermoset molding compositions known in the art are generally thermosetting resins containing inorganic fillers and/or fibers. Upon heating, thermoset monomers initially exhibit viscosities low enough to allow for melt processing and molding of an article from the filled monomer composition. Upon further heating the thermosetting monomers react and cure to form hard resins with high modulus.

There remains a need for thermoset compositions exhibiting improved combinations of properties including curing rate, toughness, stiffness, and heat resistance.

BRIEF SUMMARY

One embodiment is a curable composition comprising: a functionalized poly(arylene ether); an alkenyl aromatic monomer and an alkoxylated acryloyl monomer. The present inventors have found that this composition provides a highly desirable combination of fast curing, reduced curing rate oxygen sensitivity, high toughness, high stiffness, and high heat resistance. At least one of these properties is compromised if any of the components is omitted.

Other embodiments, including a cured composition, an article comprising a cured composition, and a method of preparing a curable composition are described in detail below.

DETAILED DESCRIPTION OF THE PREFERRED EMBODIMENTS

One embodiment is a thermoset composition, comprising: a functionalized poly(arylene ether); an alkenyl aromatic monomer; and an acryloyl monomer.

The functionalized poly(arylene ether) may be a capped poly(arylene ether). The capped poly(arylene ether) is defined herein as a poly(arylene ether) in which at least 50%, preferably at least 75%, more preferably at least 90%, yet more preferably at least 95%, even more preferably at least 99%, of the free hydroxyl groups present in the corresponding uncapped poly(arylene ether) have been functionalized by reaction with a capping agent.

The capped poly(arylene ether) may be represented by the structure $$Q(J—K)_y$$

wherein Q is the residuum of a monohydric, dihydric, or polyhydric phenol, preferably the residuum of a monohydric or dihydric phenol, more preferably the residuum of a monohydric phenol; y is 1 to 100; J comprises recurring units having the structure

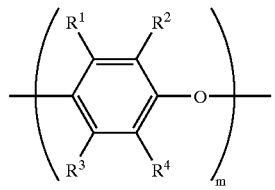

wherein m is 1 to about 200, preferably 2 to about 200, and $R^1$–$R^4$ are each independently hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_2$–$C_{12}$ halohydrocarbonoxy wherein at least two carbon atoms separate the halogen and oxygen atoms, or the like; and K is a capping group produced by reaction of a phenolic hydroxyl group on the poly(arylene ether) with a capping reagent. The resulting capping group may be

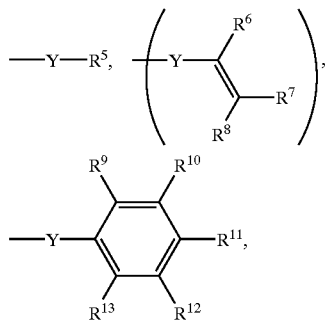

or the like, wherein $R^5$ is $C_1$–$C_{12}$ alkyl, or the like; $R^6$–$R^8$ are each independently hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_7$–$C_{18}$ alkyl-substituted aryloxycarbonyl, $C_7$–$C_{18}$ aryl-substituted alkoxycarbonyl, nitrile, formyl, carboxylate, imidate, thiocarboxylate, or the like; $R^9$–$R^{13}$ are each independently hydrogen, halogen, $C_1$–$C_{12}$ alkyl, hydroxy, amino, or the like; and wherein Y is a divalent group such as

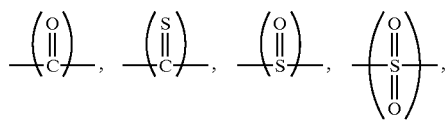

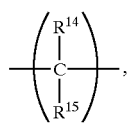

or the like, wherein $R^{14}$ and $R^{15}$ are each independently hydrogen, $C_1$–$C_{12}$ alkyl, or the like.

In one embodiment, Q is the residuum of a phenol, including polyfunctional phenols, and includes radicals of the structure

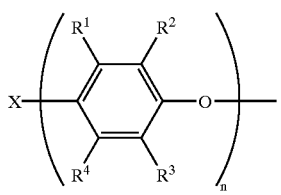

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ aminoalkyl, $C_1$–$C_{12}$ hydrocarbonoxy, $C_1$–$C_{12}$ halohydrocarbonoxy wherein at least two carbon atoms separate the halogen and oxygen atoms, or the like; X may be hydrogen, $C_1$–$C_{12}$ alkyl, $C_6$–$C_{18}$ aryl, $C_7$–$C_{18}$ alkyl-substituted aryl, $C_7$–$C_{18}$ aryl-substituted alkyl, or any of the foregoing hydrocarbon groups containing at least one substituent such as carboxylic acid, aldehyde, alcohol, amino radicals, or the like; X also may be sulfur, sulfonyl, sulfuryl, oxygen, or other such bridging group having a valence of 2 or greater to result in various bis- or higher polyphenols; y and n are each independently 1 to about 100, preferably 1 to 3, and more preferably about 1 to 2; in a preferred embodiment, y=n.

In one embodiment, the capped poly(arylene ether) is produced by capping a poly(arylene ether) consisting essentially of the polymerization product of at least one monohydric phenol having the structure

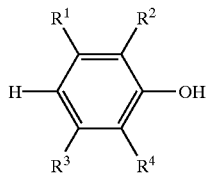

wherein $R^1$–$R^4$ are each independently hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_2$–$C_{12}$ halohydrocarbonoxy wherein at least two carbon atoms separate the halogen and oxygen atoms, or the like. Suitable monohydric phenols include those described in U.S. Pat. No. 3,306,875 to Hay, and highly preferred monohydric phenols include 2,6-dimethylphenol and 2,3,6-trimethylphenol. The poly(arylene ether) may be a copolymer of at least two monohydric phenols, such as 2,6-dimethylphenol and 2,3,6-trimethylphenol.

In a preferred embodiment, the capped poly(arylene ether) comprises at least one capping group having the structure

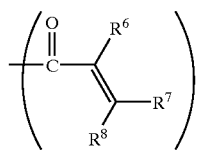

wherein $R^6$–$R^8$ are each independently hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_7$–$C_{18}$ alkyl-substituted aryloxycarbonyl, nitrile, formyl, carboxylate, imidate, thiocarboxylate, or the like. Highly preferred capping groups include acrylate ($R^6$=$R^7$=$R^8$=hydrogen) and methacrylate ($R^6$=methyl, $R^7$=$R^8$=hydrogen).

In another preferred embodiment, the capped poly(arylene ether) comprises at least one capping group having the structure

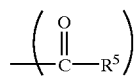

wherein $R^5$ is $C_1$–$C_{12}$ alkyl, preferably $C_1$–$C_6$ alkyl, more preferably methyl, ethyl, or isopropyl. The present inventors have surprisingly found that the advantageous properties of their composition can be achieved even when the capped poly(arylene ether) lacks a polymerizable function such as a carbon-carbon double bond.

In yet another preferred embodiment, the capped poly(arylene ether) comprises at least one capping group having the structure

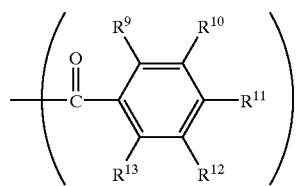

wherein $R^9$–$R^{13}$ are each independently hydrogen, halogen, $C_1$–$C_{12}$ alkyl, hydroxy, amino, or the like. Preferred capping groups of this type include salicylate ($R^9$=hydroxy, $R^{10}$–$R^{13}$=hydrogen).

In still another preferred embodiment, the capped poly(arylene ether) comprises at least one capping group having the structure

wherein A is a saturated or unsaturated $C_2$–$C_{12}$ divalent hydrocarbon group such as, for example, ethylene, 1,2-propylene, 1,3-propylene, 2-methyl-1,3-propylene, 2,2-dimethyl-1,3-propylene, 1,2-butylene, 1,3-butylene, 1,4-butylene, 2-methyl-1,4-butylene, 2,2-dimethyl-1,4-butylene, 2,3-dimethyl-1,4-butylene, vinylene (—CH=CH—), 1,2-phenylene, and the like. These capped poly(arylene ether) resins may conveniently be prepared, for example, by reaction of an uncapped poly(arylene ether) with a cyclic anhydride capping agent. Such cyclic anhydride capping agents include, for example, acetic anhydride, methacrylic anhydride, acrylic anhydride, salicylic anhydride, succinic anhydride, glutaric anhydride, propionic anhydride, isobutyric anhydride, maleic anhydride, adipic anhydride, phthalic anhydride, and the like, and combinations comprising at least one of the foregoing capping agents.

In a preferred embodiment, the capped poly(arylene ether) is substantially free of amino substituents, including alkylamino and dialkylamino substituents, wherein substantially free means that the capped poly(arylene ether) contains less than about 300 micrograms, preferably less than about 100 micrograms, of atomic nitrogen per gram of capped poly(arylene ether). Although many poly(arylene ether)s are synthesized by processes that result in the incorporation of amino substituents, the present inventors have found that thermoset curing rates are increased when the capped poly(arylene ether) is substantially free of amino substituents. Poly(arylene ether)s substantially free of amino substituents may be synthesized directly or generated by heating amino-substituted poly(arylene ether)s to at least about 200° C. Alternatively, if the capped poly(arylene ether) contains amino substituents, it may be desirable to cure the composition at a temperature less than about 200° C.

There is no particular limitation on the method by which the capped poly(arylene ether) is prepared. The capped poly(arylene ether) may be formed by the reaction of an uncapped poly(arylene ether) with a capping agent. Capping agents include compounds known in the literature to react with phenolic groups. Such compounds include both monomers and polymers containing, for example, anhydride, acid chloride, epoxy, carbonate, ester, isocyanate, cyanate ester, or alkyl halide radicals. Capping agents are not limited to organic compounds as, for example, phosphorus and sulfur based capping agents also are included. Examples of capping agents include, for example, acetic anhydride, succinic anhydride, maleic anhydride, salicylic anhydride, polyesters comprising salicylate units, homopolyesters of salicylic acid, acrylic anhydride, methacrylic anhydride, glycidyl acrylate, glycidyl methacrylate, acetyl chloride, benzoyl chloride, diphenyl carbonates such as di(4-nitrophenyl) carbonate, acryloyl esters, methacryloyl esters, acetyl esters, phenylisocyanate, 3-isopropenyl-alpha,alpha-dimethylphenylisocyanate, cyanatobenzene, 2,2-bis(4-cyanatophenyl)propane), 3-(alpha-chloromethyl)styrene, 4-(alpha-chloromethyl)styrene, allyl bromide, and the like, carbonate and substituted derivatives thereof, and mixtures thereof. These and other methods of forming capped poly (arylene ether)s are described, for example, in U.S. Pat. No. 3,375,228 to Holoch et al.; U.S. Pat. No. 4,148,843 to Goossens; U.S. Pat. Nos. 4,562,243, 4,663,402, 4,665,137, and 5,091,480 to Percec et al.; U.S. Pat. Nos. 5,071,922, 5,079,268, 5,304,600, and 5,310,820 to Nelissen et al.; U.S. Pat No. 5,338,796 to Vianello et al.; and European Patent No. 261,574 B1 to Peters et al.

In a preferred embodiment, the capped poly(arylene ether) may be prepared by reaction of an uncapped poly (arylene ether) with an anhydride in an alkenyl aromatic monomer as solvent. This approach has the advantage of generating the capped poly(arylene ether) in a form that can be immediately blended with other components to form a curable composition; using this method, no isolation of the capped poly(arylene ether) or removal of unwanted solvents or reagents is required.

A capping catalyst may be employed in the reaction of an uncapped poly(arylene ether) with an anhydride. Examples of such compounds include those known to the art that are capable of catalyzing condensation of phenols with the capping agents described above. Useful materials are basic compounds including, for example, basic compound hydroxide salts such as sodium hydroxide, potassium hydroxide, tetraalkylammonium hydroxides, and the like; tertiary alkylamines such as tributyl amine, triethylamine, dimethylbenzylamine, dimethylbutylamine and the like; tertiary mixed alkyl-arylamines and substituted derivatives thereof such as N,N-dimethylaniline; heterocyclic amines such as imidazoles, pyridines, and substituted derivatives thereof such as 2-methylimidazole, 2-vinylimidazole, 4-(dimethylamino)pyridine, 4-(1-pyrrolino)pyridine, 4-(1-piperidino)pyridine, 2-vinylpyridine, 3-vinylpyridine, 4-vinylpyridine, and the like. Also useful are organometallic salts such as, for example, tin and zinc salts known to catalyze the condensation of, for example, isocyanates or cyanate esters with phenols. The organometallic salts useful in this regard are known to the art in numerous publications and patents well known to those skilled in this art.

The functionalized poly(arylene ether) may be a ring-functionalized poly(arylene ether). A ring-functionalized poly(arylene ether) is defined herein as a poly(arylene ether) comprising repeating structural units of the formula

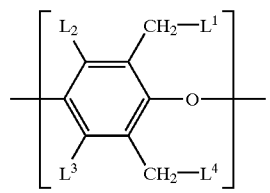

wherein each $L^1$–$L^4$ is independently hydrogen, an alkenyl group, or an alkynyl group; wherein the alkenyl group is represented by

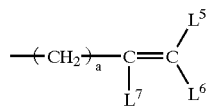

wherein $L^5$–$L^7$ are independently hydrogen or methyl, and a is an integer from 1 to 4; wherein the alkynyl group is represented by

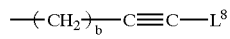

wherein $L^8$ is hydrogen, methyl, or ethyl, and b is an integer from 1 to 4; and wherein about 0.02 mole percent to about 25 mole percent of the total $L^1$–$L^4$ substituents in the ring-functionalized poly(arylene ether) are alkenyl and/or alkynyl groups. Within this range, it may be preferred to have at least about 0.1 mole percent, more preferably at least about 0.5 mole percent, alkenyl and/or alkynyl groups. Also within this range, it may be preferred to have up to about 15 mole percent, more preferably up to about 10 mole percent, alkenyl and/or alkynyl groups.

The ring-functionalized poly(arylene ether) may be prepared according to known methods. For example, an unfunctionalized poly(arylene ether) such as poly(2,6-dimethyl-1, 4-phenylene ether) may be metalized with a reagent such as n-butyl lithium and subsequently reacted with an alkenyl halide such as allyl bromide and/or an alkynyl halide such as propargyl bromide. This and other methods for preparation of ring-functionalized poly(arylene ether) resins are described, for example, in U.S. Pat. No. 4,923,932 to Katayose et al.

It will be understood that the poly(arylene ether)s described herein as "uncapped" or "unfunctionalized" comprise repeating structural units having the formula

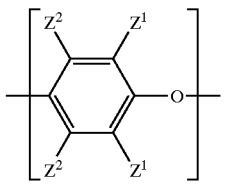

wherein for each structural unit, each $Z^1$ is independently hydrogen, halogen, primary or secondary $C_1$–$C_{12}$ alkyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms, or the like; and each $Z^2$ is independently halogen, primary or secondary $C_1$–$C_{12}$ alkyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms, or the like. Preferably, each $Z^1$ is $C_{1-4}$ alkyl, and each $Z^2$ is hydrogen or methyl.

There is no particular limitation on the molecular weight or intrinsic viscosity of the functionalized poly(arylene ether). In one embodiment, the composition may comprise a capped poly(arylene ether) having a number average molecular weight up to about 10,000 atomic mass units (AMU), preferably up to about 5,000 AMU, more preferably up to about 3,000 AMU. Such a capped poly(arylene ether) may be useful in preparing and processing the composition by reducing its viscosity. In another embodiment, the composition may comprise a capped poly(arylene ether) having an intrinsic viscosity of about 0.15 to about 0.30 deciliters per gram (dl/g), preferably about 0.20 to about 0.25 dl/g, as measured in chloroform at 25° C. Generally, the intrinsic viscosity of the capped poly(arylene ether) will vary insignificantly from the intrinsic viscosity of the corresponding uncapped poly(arylene ether). These intrinsic viscosities may correspond approximately to number average molecular weights of about 5,000 to about 25,000 AMU, preferably about 8,000 to about 20,000 AMU, more preferably about 10,000 to about 15,000 AMU. Such a capped poly(arylene ether) may provide the composition with a desirable balance of toughness and processability. It is expressly contemplated to employ blends of at least two capped poly(arylene ether)s having different molecular weights and intrinsic viscosities.

The composition may comprise a blend of at least two functionalized poly(arylene ether)s. Such blends may be prepared from individually prepared and isolated functionalized poly(arylene ethers). Alternatively, blends of capped poly(arylene ether)s may be prepared by reacting a single poly(arylene ether) with at least two capping agents.

The composition may comprise the capped poly(arylene ether) in an amount of at least about 1 part, preferably at least about 10 parts, more preferably at least about 15 parts, per 100 parts total of the capped poly(arylene ether), the alkenyl aromatic monomer, and the acryloyl monomer. The composition may comprise the capped poly(arylene ether) in an amount of up to about 69 parts, preferably up to about 50 parts, more preferably up to about 40 parts, per 100 parts total of the capped poly(arylene ether), the alkenyl aromatic monomer, and the acryloyl monomer.

The composition further comprises an alkenyl aromatic monomer. The alkenyl aromatic monomer may have the structure

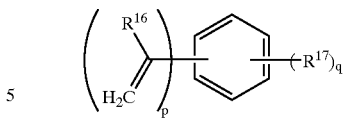

wherein each $R^{16}$ is independently hydrogen, $C_1$–$C_{12}$ alkyl, $C_2$–$C_{12}$ alkenyl, $C_2$–$C_{12}$ alkynyl, $C_6$–$C_{18}$ aryl, or the like; each $R^{17}$ is independently halogen, $C_1$–$C_{12}$ alkyl, $C_1$–$C_{12}$ alkoxyl, $C_6$–$C_{18}$ aryl, or the like; p is 1 to 4; and q is 0 to 5. When p=1, the alkenyl aromatic monomer is termed a monofunctional alkenyl aromatic monomer; when p=2–4, the alkenyl aromatic monomer is termed a polyfunctional alkenyl aromatic monomer. Suitable alkenyl aromatic monomers include styrene, alpha-methylstyrene, alpha-ethylstyrene, alpha-isopropylstyrene, alpha-tertiary-butylstyrene, alpha-phenylstyrene, and the like; halogenated styrenes such as chlorostyrene, dichlorostyrene, trichlorostyrene, bromostyrene, dibromostyrene, tribromostyrene, fluorostyrene, difluorostyrene, trifluorostyrene, tetrafluorostyrene, pentafluorostyrene, and the like; halogenated alkylstyrenes such as chloromethylstyrene, and the like; alkoxystyrenes such as methoxystyrene, ethoxystyrene, and the like; polyfunctional alkenyl aromatic monomers such as 1,3-divinylbenzene, 1,4-divinylbenzene, trivinylbenzene, 1,3-diisopropenylbenzene, 1,4-diisopropenylbenzene, and the like; and mixtures comprising at least one of the foregoing alkenyl aromatic monomers. In the foregoing substituted styrenes for which no substituent position is specified, the substituents may occupy any free position on the aromatic ring.

Preferred alkenyl aromatic monomers include styrene, alpha-methylstyrene, 2-methylstyrene, 3-methylstyrene, 4-methylstyrene, 2-t-butylstyrene, 3-t-butylstyrene, 4-t-butylstyrene, 1,3-divinylbenzene, 1,4-divinylbenzene, 1,3-diisopropenylbenzene, 1,4-diisopropenylbenzene, and the like, and mixtures comprising at least one of the foregoing alkenyl aromatic monomers. Preferred alkenyl aromatic monomers further include styrenes having from 1 to 5 halogen substituents on the aromatic ring, and mixtures comprising at least one such halogenated styrene.

The composition may comprise the alkenyl aromatic monomer in an amount of at least about 30 parts, preferably at least about 40 parts, more preferably at least about 50 parts, per 100 parts total of the capped poly(arylene ether), the alkenyl aromatic monomer, and the acryloyl monomer. The composition may comprise the alkenyl aromatic monomer in an amount of up to about 98 parts, preferably up to about 80 parts, more preferably up to about 70 parts, per 100 parts total of the capped poly(arylene ether), the alkenyl aromatic monomer, and the acryloyl monomer.

The composition further comprises an acryloyl monomer. The acryloyl monomer comprises at least one acryloyl moiety having the structure

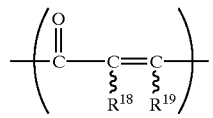

wherein $R^{18}$ and $R^{19}$ are each independently hydrogen, $C_1$–$C_{12}$ alkyl, or the like; and wherein $R^{18}$ and $R^{19}$ may be disposed either cis or trans about the carbon-carbon double bond. Preferably, $R^{18}$ and $R^{19}$ are each independently hydrogen or methyl. In one embodiment, the acryloyl monomer comprises at least two acryloyl moieties having the above structure and is termed a polyfunctional acryloyl monomer. In another embodiment, the acryloyl monomer comprises at least three acryloyl moieties having the above structure.

In one embodiment, the acryloyl monomer comprises at least one acryloyl moiety having the structure

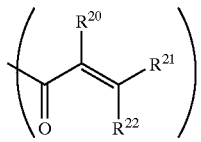

wherein $R^{20}$–$R^{22}$ are each independently hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, thiocarboxylate, or the like. Preferably, $R^{20}$–$R^{22}$ are each independently hydrogen or methyl. In one embodiment, the acryloyl monomer comprises at least two acryloyl moieties having the structure above. In another embodiment, the acryloyl monomer comprises at least three acryloyl moieties having the structure above.

Suitable acryloyl monomers include, for example, methyl (meth)acrylate, ethyl (meth)acrylate, isopropyl (meth)acrylate, n-butyl (meth)acrylate, isobutyl (meth)acrylate, 2-ethylhexyl (meth)acrylate, 2-hydroxyethyl (meth)acrylate, 3-hydroxypropyl (meth)acrylate, hydroxybutyl (meth) acrylate, glycidyl (meth)acrylate, 2,2-dimethyl-3-hydroxypropyl-2,2-dimethyl-3-hydroxypropenoate, isobornyl (meth)acrylate, tetrahydrofurfuryl (meth)acrylate, 3,4-epoxycyclohexylmethyl (meth)acrylate, and the like; halogenated (meth)acrylates such as pentabromobenzyl (meth)acrylate, and the like; and acrylic or methacrylic amides such (meth)acrylamide, diacetone (meth) acrylamide, N(2-hydroxyethyl) (meth)acrylamide, N-methyl(meth)acrylamide, N-ethyl(meth)acrylamide, N,N-dimethyl(meth)acrylamide, N,N-dimethylaminopropyl (meth)acrylamide, N,N-dimethylaminopropyl(meth) acrylamide, N,N-dimethylaminoethyl(meth)acrylamide, and the like; and mixtures comprising at least one of the foregoing acryloyl monomers. It will be understood that the suffix (meth)acryl-denotes either acryl- or methacryl-.

Suitable acryloyl monomers may further include vinyl functionalized anhydrides such as maleic anhydride; and epoxy acrylates, such as Epoxy Acrylate such as the Epoxy Acrylate sold by Sartomer Company under the trade names CN 120 AC16 and CN 118, Epoxidized Soy Bean Oil Acrylate CN 111, Epoxy Acrylate CN 104, Epoxy Acrylate CN 120, Low Viscosity Epoxy Acrylate CN 121, Epoxy Acrylate CN 124, Modified Epoxy Acrylate CN 136, Modified Epoxy Acrylate CN 115, Modified Epoxy Acrylate CN 116, Modified Epoxy Acrylate CN 117, Modified Epoxy Acrylate CN 119, Amine Modified Epoxy Acrylate CN 2100, Fatty Acid Modified Epoxy Acrylate CN 2101, Epoxy Acrylate CN 104 B80, Epoxy Acrylate CN 120 B60, Epoxy Acrylate CN 120 B80, Epoxy Acrylate CN 120 M50, Epoxy Acrylate CN 104 A80, Epoxy Acrylate CN 120 A60, Epoxy Acrylate CN 120 A75, Epoxy Acrylate CN 120 C60, Epoxy Acrylate CN 120 C80, Epoxy Acrylate CN 120 E50, Epoxy Acrylate CN 120 D80, Epoxy Acrylate with Styrene CN 120 S80, Epoxy Novolac Acrylate CN 112 C60, Epoxy Methacrylate CN 151, and the like.

Suitable acryloyl monomers may further include (meth) acrylic acid, crotonic acid, itaconic acid, maleic acid, fumaric acid, and the like; monoesters between a polyether polyol (e.g., polyethylene glycol, polypropylene glycol or polybutylene glycol) and an unsaturated carboxylic acid (e.g., (meth)acrylic acid); monoethers between a polyether polyol (e.g., polyethylene glycol, polypropylene glycol or polybutylene glycol) and a hydroxyl group-containing unsaturated monomer (e.g., 2-hydroxyethyl (meth)acrylate); adducts between an alpha,beta-unsaturated carboxylic acid and a monoepoxy compound (e.g., CARDURA® E10 from Shell Japan Ltd.) or an alpha-olefin epoxide; adducts between glycidyl (meth)acrylate and a monobasic acid (e.g., acetic acid, propionic acid, p-t-butylbenzoic acid, or a fatty acid); monoesters or diesters between an acid anhydride group-containing unsaturated compound (e.g., maleic anhydride or itaconic anhydride) and a glycol (e.g., ethylene glycol, 1,6-hexanediol or neopentyl glycol); hydroxyalkyl vinyl ethers such as hydroxyethyl vinyl ether, and the like; chlorine- and hydroxyl group-containing monomers such as 3-chloro-2-hydroxypropyl (meth)acrylate, and the like; $C_{2-18}$ alkoxyalkyl esters of (meth)acrylic acid, such as methoxybutyl (meth)acrylate, ethoxybutyl (meth)acrylate, and the like; hydrocarbon ring-containing acrylate monomers such as phenyl (meth)acrylate, phenylethyl (meth) acrylate, phenylpropyl (meth)acrylate, benzyl (meth) acrylate, phenoxyethyl (meth)acrylate, cyclohexyl (meth) acrylate, 2-acryloyloxyethyl hydrogenphthalate, 2-acryloyloxypropyl hydrogenphthalate, 2-acryloyloxypropyl hexahydrogenphthalate, 2-acryloyloxypropyl tetrahydrogenphthalate, an ester between p-t-butylbenzoic acid and hydroxyethyl (meth)acrylate, dicyclopentenyl (meth)acrylate, and the like; and mixtures comprising at least one of the foregoing acryloyl monomers.

In one embodiment, the acryloyl monomer is an alkoxylated acryloyl monomer. Suitable alkoxylated acryloyl monomers include those having the structure

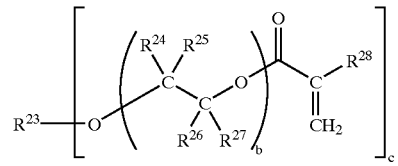

wherein $R^{23}$ is a $C_1$–$C_{250}$, preferably $C_1$–$C_{24}$, organic group having a valence of c; each occurrence of $R^{24}$–$R^{27}$ is independently hydrogen, $C_1$–$C_6$ alkyl, or $C_6$–$C_{12}$ aryl; each occurrence of b is independently 0 to about 20 with the proviso that at least one occurrence of b is at least 1; each occurrence of $R^{28}$ is independently hydrogen or methyl; and c is 1 to about 10.

Within the above-stated range of 1 to about 20, the number of repeating alkoxy units, b, is preferably at least 2, more preferably at least 3. Also within this range, b is preferably up to about 15, more preferably up to about 10.

Within the above-stated range of 1 to about 10, the number of alkoxylated acrylate units, c, is preferably at least 2, more preferably at least 3. Also within this range, c is preferably up to about 8, more preferably up to about 6.

Suitable alkoxylated acryloyl monomers include, for example, (ethoxylated)$_{1-20}$ nonylphenol (meth)acrylate, (propoxylated)$_{1-20}$ nonylphenol (meth)acrylate, (ethoxylated)$_{1-20}$ tetrahydrofurfuryl (meth)acrylate, (propoxylated)$_{1-20}$ tetrahydrofurfuryl (meth)acrylate, (ethoxylated)$_{1-20}$ hydroxyethyl (meth)acrylate, (propoxylated)$_{1-20}$ hydroxyethyl (meth)acrylate, (ethoxylated)$_{2-40}$ 1,6-hexanediol di(meth)acrylate, (propoxylated)$_{2-40}$ 1,6-hexanediol di(meth)acrylate, (ethoxylated)$_{2-40}$ 1,4-butanediol di(meth)acrylate, (propoxylated)$_{2-40}$ 1,4-butanediol di(meth)acrylate, (ethoxylated)$_{2-40}$ 1,3-butanediol di(meth)acrylate, (propoxylated)$_{2-40}$ 1,3-butanediol di(meth)acrylate, (ethoxylated)$_{2-40}$ ethylene glycol di(meth)acrylate, (propoxylated)$_{2-40}$ ethylene glycol di(meth)acrylate, (ethoxylated)$_{2-40}$ propylene glycol di(meth)acrylate, (propoxylated)$_{2-40}$ propylene glycol di(meth)acrylate, dipropylene glycol di(meth)acrylate, dipropylene glycol di(meth)acrylate, tetrapropylene glycol di(meth)acrylate, tetrapropylene glycol di(meth)acrylate, tetraethylene glycol di(meth)acrylate, tetraethylene glycol di(meth)acrylate, (ethoxylated)$_{2-40}$ 1,4-cyclohexanedimethanol di(meth)acrylate, (propoxylated)$_{2-40}$ 1,4-cyclohexanedimethanol di(meth)acrylate, (ethoxylated)$_{2-40}$ bisphenol-A di(meth)acrylate, (propoxylated)$_{2-40}$ bisphenol-A di(meth)acrylate, (ethoxylated)$_{2-40}$ tetrabromobisphenol A di(meth)acrylate, (propoxylated)$_{2-40}$ tetrabromobisphenol A di(meth)acrylate, (ethoxylated)$_{2-40}$ neopentylene glycol di(meth)acrylate, (propoxylated)$_{2-40}$ neopentylene glycol di(meth)acrylate, (ethoxylated)$_{3-60}$ glycerol tri(meth)acrylate, (propoxylated)$_{3-60}$ glycerol tri(meth)acrylate, (ethoxylated)$_{3-60}$ trimethylolpropane tri(meth)acrylate, (propoxylated)$_{3-60}$ trimethylolpropane tri(meth)acrylate, (ethoxylated)$_{3-60}$ isocyanurate tri(meth)acrylate, (ethoxylated)$_{3-60}$ isocyanurate tri(meth)acrylate, tris(2-hydroxyethyl)isocyanurate tri(meth)acrylate, (ethoxylated)$_{4-80}$ pentaerythritol tetra(meth)acrylate, (propoxylated)$_{4-80}$ pentaerythritol tetra(meth)acrylate, (ethoxylated)$_{6-120}$ dipentaerythritol tetra(meth)acrylate, (propoxylated)$_{6-120}$ dipentaerythritol tetra(meth)acrylate, and combinations comprising at least one of the foregoing alkoxylated acryloyl monomers. It will be understood that the subscripted numbers (e.g., the "2–40" in "(ethoxylated)$_{2-40}$ 1,4-butanediol di(meth)acrylate") represent the average number of alkoxyl groups in the acryloyl monomer.

Preferred alkoxylated acryloyl monomers include, for example, (ethoxylated)$_{3-60}$ trimethylolpropane tri(meth)acrylate, (propoxylated)$_{3-60}$ trimethylolpropane tri(meth)acrylate, (ethoxylated)$_{2-40}$ bisphenol-A di(meth)acrylate, (propoxylated)$_{2-40}$ bisphenol-A di(meth)acrylate, (ethoxylated)$_{2-40}$ cyclohexanedimethanol di(meth)acrylate, (propoxylated)$_{2-40}$ cyclohexanedimethanol di(meth)acrylate, dipropylene glycol di(meth)acrylate, and the like, and combinations comprising at least one of the foregoing alkoxylated acryloyl monomers.

In one embodiment, the composition may comprise an alkoxylated acryloyl monomer in combination with a non-alkoxylated acryloyl monomer, wherein the non-alkoxylated acryloyl monomer is an acryloyl monomer, as defined above, lacking an alkoxyl group having the formula

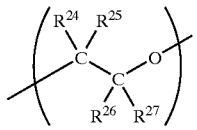

wherein each $R^{24}$–$R^{27}$ is independently hydrogen, $C_1$–$C_6$ alkyl, or $C_6$–$C_{12}$ aryl.

Specific suitable acryloyl monomers include, for example, allyl methacrylate, caprolactone acrylate, glycidyl methacrylate, isobornyl acrylate, isobornyl methacrylate, isodecyl acrylate, isodecyl methacrylate, isooctyl acrylate, lauryl acrylate, lauryl methacrylate, methoxy polyethylene glycol (number average molecular weight, $M_n$, of PEG portion=350 g/mol) monomethacrylate, methoxy polyethylene glycol ($M_n$ of PEG portion=550 g/mol) monomethacrylate, 2-phenoxyethyl acrylate, 2-phenoxyethyl methacrylate, polypropylene glycol monomethacrylate, propoxylated 2-allyl methacrylate, stearyl acrylate, stearyl methacrylate, tetrahydrofurfuryl acrylate, tetrahydrofurfuryl methacrylate, tridecyl acrylate, tridecyl methacrylate, and the like; and mixtures comprising at least one of the foregoing acryloyl monomers.

Suitable acryloyl monomers may further include, for example, unsaturated polyester resins that are the polycondensation reaction product of one or more dihydric alcohols and one or more ethylenically unsaturated polycarboxylic acids. By polycarboxylic acid is meant polycarboxylic or dicarboxylic acids or anhydrides, polycarboxylic or dicarboxylic acid halides, and polycarboxylic or dicarboxylic esters. For example, suitable unsaturated polycarboxylic acids, and the corresponding anhydrides and the acid halides that contain polymerizable carbon-to-carbon double bonds, may include maleic anhydride, maleic acid, and fumaric acid. A minor proportion of the unsaturated acid, up to about forty mole percent, may be replaced by dicarboxylic or polycarboxylic acid that does not contain a polymerizable carbon-to-carbon bond. Examples thereof include the acids (and corresponding anhydrides and acid halides): orthophthalic, isophthalic, terephthalic, succinic, adipic, sebacic, methylsuccinic, and the like. Dihydric alcohols that are useful in preparing the polyesters include, for example, 1,2-propane diol (hereinafter referred to as propylene glycol), dipropylene glycol, diethylene glycol, 1,3-butanediol, ethylene glycol, glycerol, and the like. Examples of suitable unsaturated polyesters are the polycondensation products of (1) propylene glycol and maleic and/or fumaric acids; (2) 1,3-butanediol and maleic and/or fumaric acids; (3) combinations of ethylene and propylene glycols (approximately 50 mole percent or less of ethylene glycol) and maleic and/or fumaric acids; (4) propylene glycol, maleic and/or fumaric acids and dicyclopentadiene reacted with water; and the like; and mixtures comprising at least one of the foregoing acryloyl monomers. In addition to the above described polyesters, dicyclopentadiene modified unsaturated polyester resins such as those described in U.S. Pat. No. 3,883,612 to Pratt et al. may be used. The molecular weight of the polymerizable unsaturated polyester may vary over a considerable range, but ordinarily useful polyesters have a number average molecular weight of about 300 AMU to about 5,000 AMU, and more preferably about 500 AMU to about 5,000 AMU.

In a preferred embodiment, the acryloyl monomer may include compounds having greater than one acrylate moiety per molecule. Illustrative examples include compounds produced by condensation of an acrylic or methacrylic acid with a di-epoxide, such as bisphenol-A diglycidyl ether, butanediol diglycidyl ether, or neopentylene glycol dimethacrylate. Specific examples include 1,4-butanediol diglycidylether di(meth)acrylate, bisphenol-A diglycidylether dimethacrylate, and neopentylglycol diglycidylether di(meth)acrylate, and the like. Also included as acryloyl monomers are the condensation of reactive acrylate or methacrylate compounds with alcohols or amines to produce the resulting polyfunctional acrylates or polyfunctional acrylamides. Examples include N,N-bis(2-hydroxyethyl) (meth)acrylamide, methylenebis((meth)acrylamide), 1,6-hexamethylenebis((meth)acrylamide), diethylenetriamine tris((meth)acrylamide), bis(gamma-((meth)acrylamide) propoxy) ethane, beta-((meth)acrylamide) ethylacrylate, ethylene glycol di((meth)acrylate)), diethylene glycol di(meth)acrylate, tetraethylene glycol di(meth)

acrylateglycerol di(meth)acrylate, glycerol tri(meth) acrylate, 1,3-propylene glycol di(meth)acrylate, dipropyleneglycol di(meth)acrylate, 1,4-butanediol di(meth)acrylate, 1,2,4-butanetriol tri(meth)acrylate, 1,6-hexanedioldi(meth) acrylate, 1,4-cyclohexanediol di(meth)acrylate, 1,4-benzenediol di(meth)acrylate, pentaerythritoltetra(meth) acrylate, 1,5-pentanediol di(meth)acrylate, trimethylolpropane di(meth)acrylate, trimethylolpropane tri (meth)acrylate), 1,3,5-triacryloylhexahydro-1,3,5-triazine, 2,2-bis(4-(2-(meth)acryloxyethoxy)phenyl)propane, 2,2-bis (4-(2-(meth)acryloxyethoxy)-3,5-dibromophenyl)propane, 2,2-bis((4-(meth)acryloxy)phenyl)propane, 2,2-bis((4-(meth)acryloxy)-3,5-dibromophenyl)propane, and the like, and mixtures comprising at least one of the foregoing acryloyl monomers.

In addition to the acryloyl monomers described above, the acryloyl monomers may include 1,4-butanediol di(meth) acrylate, 1,4-butanediol dimethacrylate, 1,3-butanediol glycol diacrylate, 1,3-butylene glycol dimethacrylate, cyclohexane dimethanol diacrylate, cyclohexane dimethanol dimethacrylate, diethylene glycol diacrylate, diethylene glycol dimethacrylate, dipropylene glycol diacrylate, ethylene glycol dimethacrylate, 1,6-hexanediol di(meth)acrylate, neopentyl glycol di(meth)acrylate, polyethylene glycol ($M_n$=200–600) di(meth)acrylate, tetraethylene glycol di(meth)acrylate, triethylene glycol di(meth)acrylate, tripropylene glycol di(meth)acrylate, and the like; and tetrafunctional and pentafunctional monomers such as dipentaerythritol penta(meth)acrylate, di-(trimethylolpropane) tetra (meth)acrylate, dipentaerythritol penta(meth)acrylate ester, pentaerythritol tetra(meth)acrylate, and the like; and mixtures comprising at least one of the foregoing acryloyl monomers.

Suitable acryloyl monomers may further include trifunctional urethane (meth)acrylates, such as the trifunctional urethane (meth)acrylates sold by Sartomer Company under the product names CN 929, CN 945 A60, CN 945 B85, CN 959, CN 962, CN 964, CN 965, CN 968, CN 980, CN 981, CN 983, CN 984, CN 944 B85, CN 953 B70, CN 963 B80, CN 964B85, CN 966 B85, CN 981 B88, CN 982 B88, CN 983 B88, CN 985 B88, CN 961 H81, CN 966 H90, CN 982 P90, CN 963 A80, CN 964 A85, CN 965 A80, CN 966 A80, CN 981 A75, CN 982 A75, CN 980 M50, CN 961 E75, CN 963 E75, CN 963 E80, CN 964 E75, CN 982 E75, CN 963 J85, CN 966 J75, CN 966 I80, CN 966 R60, and CN 964 H90; hexafunctional urethane (meth)acrylates, such as the hexafunctional urethane (meth)acrylates sold by Sartomer Company under the product name CN 975; and urethane (meth)acrylates such as the urethane (meth)acrylates sold by Sartomer Company under the product names CN 972, CN 2901, CN 2902, CN 978, CN 999, CN 970 H75, CN 973 H85, CN 970 A60, CN 971 A80, CN 973 A80, CN 977 C70, CN 970 E60, CN 973 J75, and CN 1963; and the like; and mixtures comprising at least one of the foregoing acryloyl monomers.

Suitable acryloyl monomer may further include low viscosity oligomers, such as the low viscosity oligomers sold by Sartomer Company under the product numbers CN 130, CN 131, CN 135, and CN 137; polyester acrylate oligomers, such as the polyester acrylate oligomers sold by Sartomer Company under the product names Polyester Acrylate CN 293, CN 292, and CN 2200, and Chlorinated Polyester Acrylate CN 2201; adhesion promoting oligomers, such as the adhesion promoting oligomers sold by Sartomer Company under the product number CN 704; polybutadiene dimethacrylates, such as the polybutadiene dimethacrylates sold by Sartomer Company under the product numbers CN 301 and CN 303; Polybutadiene Urethane Diacrylate CN 302, and Polybutadiene Dimethacrylate CN 303; specialty oligomers, such as the specialty oligomers sold by Sartomer Company under the tradename SARBOX® as, for example, Aromatic Acid Methacrylate Half Ester in EEP Ester Solvent SB 401, SB 404, and SB 405, Aromatic Acid Methacrylate Half Ester in PM, Alcohol/EEP Ester Solvent SB 402, Aromatic Acid Methacrylate Half Ester in PM, Alcohol Solvent SB 400, Aromatic Acid Acrylate Half Ester in SR 339 SB 520 M35, Aromatic Acid Acrylate Half Ester in SR454 SB 520 E35, Aromatic Acid Methacrylate Half Ester in SR306 SB 520 A20, Aromatic Acid Methacrylate Half Ester in SR344 SB 500 K60, Aromatic Acid Methacrylate Half Ester in SR454 SB 500 E50, and Aromatic Acid Methacrylate Half Ester in SR454 SB 510 E35; acrylates, including, Low Viscosity Triacrylate Oligomer CN 132, Low Viscosity Triacrylate Oligomer CN 133, Low Viscosity Monoacrylate Oligomer CN 152, Urethane Acrylate CN 959, Polyester Acrylate CN 293, Urethane Acrylate CN 968, Urethane Acrylate CN 2901, Urethane Acrylate CN 2902, Urethane Acrylate CN 999, Low Viscosity Aliphatic Monoacrylate CN 135, Low Viscosity Aliphatic Monoacrylate CN 137, Amine Modified Epoxy Acrylate CN 2100, Fatty Acid Modified Epoxy Acrylate CN 2101, Polyester Acrylate CN 2200, Chlorinated Polyester Acrylate CN 2201, Acrylated Acrylic CN 2800, Epoxy Acrylate CN 120 AC16, Polybutadiene Urethane Diacrylate CN 302, Polybutadiene Dimethacrylate CN 303, (Meth)Acrylate Functional Monomer P-Cure 300, and (Meth)Acrylate Functional Monomer P-Cure 301; functional acrylic oligomers, such as the functional acrylic oligomers sold by Sartomer Company under the tradename SARCRYL® as SARCRYL® Functional AcrylicSarcryl CN816, SARCRYL® Functional Acrylic-Sarcryl CN817, SARCRYL® Functional AcrylicSarcryl CN818, Amine Modified Polyether Acrylate CN 501, Amine Modified Polyether Acrylate CN 502, Amine Modified Polyether Acrylate CN 550, Amine Modified Polyether Acrylate CN 551, Alkoxylated Trifunctional Acrylate Ester such as SR 9008 sold by Sartomer Co., Metallic Diacrylate SR 9016, and metallic diacrylates such as zinc diacrylate, lithium diacrylate, sodium diacrylate, magnesium diacrylate, calcium diacrylate, aluminum diacrylate, Monofunctional Acid Ester CD 9050, Trifunctional Acid Ester CD 9051 and CD 9052, Trifunctional Acrylate Ester SR 9012, and Trifunctional Methacrylate Ester SR 9009 and SR 9011; and the like; and mixtures comprising at least one of the foregoing acryloyl monomers.

Highly preferred acryloyl monomers include trimethylolpropane tri(meth)acrylate, 1,6-hexanediol di(meth)acrylate, ethylene glycol di(meth)acrylate, propylene glycol di(meth) acrylate, cyclohexanedimethanol di(meth)acrylate, butanedioldi(meth)acrylate, diethylene glycol di(meth) acrylate, triethylene glycol di(meth)acrylate, isobornyl (meth)acrylate, cyclohexyl (meth)acrylate, butyl(meth) acrylate, methyl (meth)acrylate, dibutyl fumarate, dibutyl maleate, glycidyl (meth)acrylate, ethyl (meth)acrylate, 2-ethylhexyl (meth)acrylate, hexyl (meth)acrylate, lauryl (meth)acrylate, stearyl (meth)acrylate, decyl (meth)acrylate, octyl (meth)acrylate, and the like, and mixtures comprising at least one of the foregoing acryloyl monomers.

In a preferred embodiment, the acryloyl monomer comprises an acryloyl monomer having a number average molecular weight less than about 1,000 AMU and an acryloyl monomer having a number average molecular weight greater than about 2,500 AMU; more preferably the acryloyl monomer comprises an acryloyl monomer having a number average molecular weight less than about 500 AMU and an acryloyl monomer having a number average molecular weight greater than about 3,000 AMU.

The composition may comprise the acryloyl monomer in an amount of at least about 1 part, preferably at least about 5 parts, more preferably at least about 15 parts, per 100 parts total of the capped poly(arylene ether), the alkenyl aromatic monomer, and the acryloyl monomer. The composition may comprise the acryloyl monomer in an amount up to about 69 parts, preferably up to about 50 parts, more preferably up to 30 parts, per 100 parts total of the capped poly(arylene ether), the alkenyl aromatic monomer, and the acryloyl monomer.

The composition may, optionally, further comprise a multivalent metal ion. Suitable multivalent metal ions include those in Groups IIA, IIIA, and IB–VIIIB of the periodic table. Preferred multivalent ions include ions of magnesium, calcium, zinc, and aluminum. The multivalent metal ions may be present, for example, as salts with counterions including halides, hydroxides, oxides, and the like. When present, the multivalent metal ion may be used in an amount of about 0.1 parts by weight to about 5 parts by weight per 100 parts total of the capped poly(arylene ether), the alkenyl aromatic monomer, and the acryloyl monomer, where parts by weight of the multivalent metal ion are based on the elemental metal. Within this range, it may be preferred to use the multivalent metal ion in an amount of at least about 0.2 parts by weight, more preferably at least about 0.3 parts by weight, of the multivalent metal ion. Also within this range, it may be preferred to use up to about 3 parts by weight, more preferably up to about 2.5 parts by weight, of the multivalent metal ion.

The composition may, optionally, further comprise a curing catalyst to increase the curing rate of the unsaturated components. Curing catalysts, also referred to as initiators, are well known to the art and used to initiate the polymerization, cure or crosslink any of numerous thermoplastics and thermosets including unsaturated polyester, vinyl ester and allylic thermosets. Non-limiting examples of curing catalysts are those described in "Plastic Additives Handbook, 5$^{th}$ Edition" Hans Zweifel, Ed, Carl Hanser Verlag Publishers, Munich, 2001., and in U.S. Pat. No. 5,407,972 to Smith et al., and U.S. Pat No. 5,218,030 to Katayose et al. The curing catalyst for the unsaturated portion of the thermoset may include any compound capable of producing radicals at elevated temperatures. Such curing catalysts may include both peroxy and non-peroxy based radical initiators. Examples of useful peroxy initiators include, for example, benzoyl peroxide, dicumyl peroxide, methyl ethyl ketone peroxide, lauryl peroxide, cyclohexanone peroxide, t-butyl hydroperoxide, t-butyl benzene hydroperoxide, t-butyl peroctoate, 2,5-dimethylhexane-2,5-dihydroperoxide, 2,5-dimethyl-2,5-di(t-butylperoxy)-hex-3-yne, di-t-butylperoxide, t-butylcumyl peroxide, alpha,alpha'-bis(t-butylperoxy-m-isopropyl)benzene, 2,5-dimethyl-2,5-di(t-butylperoxy)hexane, dicumylperoxide, di(t-butylperoxy isophthalate, t-butylperoxybenzoate, 2,2-bis(t-butylperoxy)butane, 2,2-bis(t-butylperoxy)octane, 2,5-dimethyl-2,5-di(benzoylperoxy)hexane, di(trimethylsilyl) peroxide, trimethylsilylphenyltriphenylsilyl peroxide, and the like, and mixtures comprising at least one of the foregoing curing catalysts. Typical non-peroxy initiators include, for example, 2,3-dimethyl-2,3-diphenylbutane, 2,3-trimethylsilyloxy-2,3-diphenylbutane, and the like, and mixtures comprising at least one of the foregoing curing catalysts.

In a preferred embodiment, the curing catalyst may comprise t-butyl peroxybenzoate or methyl ethyl ketone peroxide. The curing catalyst may promote curing at a temperature of about 0° C. to about 200° C.

When present, the curing catalyst may be used in an amount of at least about 0.1 part, preferably at least about 1 part, per 100 parts total of the capped poly(arylene ether), the alkenyl aromatic monomer, and the acryloyl monomer. The curing catalyst may be used in an amount of up to about 10 parts, preferably up to about 5 parts, more preferably up to about 3 parts, per 100 parts total of the capped poly (arylene ether), the alkenyl aromatic monomer, and the acryloyl monomer.

The composition may, optionally, further comprise a curing promoter to decrease the gel time. Suitable curing promoters include transition metal salts and complexes such as cobalt naphthanate; and organic bases such as N,N-dimethylaniline (DMA) and N,N-diethylaniline (DEA). Preferably, cobalt naphthanate and DMA are used in combination. When present, the promoter may be used in an amount of about 0.05 to about 3 parts, per 100 parts total of the capped poly(arylene ether), the alkenyl aromatic monomer, and the acryloyl monomer.

When the composition is to be cured using ultraviolet light, it may further comprise a photoinitiator, such as, for example, the photoinitiators described in U.S. Pat. No. 5,407,972, including, for example, ethyl benzoin ether, isopropyl benzoin ether, butyl benzoin ether, isobutyl benzoin ether, alpha,alpha-diethoxyacetophenone, alpha,alpha-dimethoxy-alpha-phenylacetophenone, diethoxyphenyl-acetophenone, 4,4'-dicarboethoxybenzoin ethylether, benzoin phenyl ether, alpha-methylbenzoin ethyl ether alpha-methylolbenzoin methyl ether, trichloroacetophenone, and the like, and mixtures comprising at least one of the foregoing photoinitiators.

In addition to the components described above, the composition may optionally comprise an uncapped poly(arylene ether) in an amount that does not detract from the desirable properties of the composition. Such amounts can be readily determined without undue experimentation. High molecular weight uncapped poly(arylene ether)s, for example those having intrinsic viscosities of at least about 0.3 dl/g, may be preferred for this purpose.

The composition may further comprise additives known in the art, including, for example, flame retardants; lubricants including mold release agents; antioxidants; thermal stabilizers; ultraviolet-stabilizers; pigments, dyes, and colorants; anti-static agents; fillers including fibrous fillers, and polymeric fillers; conductive agents; blowing agents; and the like; and combinations comprising at least one of the foregoing additives. Such additives are described in detail in "Plastic Additives Handbook, 5$^{th}$ Edition" Hans Zweifel, Ed, Carl Hanser Verlag Publishers, Munich, 2001.

Flame retardants include, for example, brominated flame retardant compounds. Preferred brominated flame retardant compounds include, for example, brominated diphenyl ethers varying in bromination levels from 2–10 bromines per molecule such as, for example, tetrabromodiphenyloxide, pentabromodiphenyloxide, octabromodiphenyloxide, and decabromodiphenyl oxide. Other brominated derivatives include tetradecabromodiphenoxybenzene, tetrabromo-cyclooctane, 2,4,6-tribromophenylmaleimide, phenyl-1,2,3,4-tetrabromophthalamide, 2,4,6-tribromophenyl-1,2,3,4-tetrabromophthalimide, 1,4-phenylene-bis(1,2,3,4-tetrabromophthalimide), 1,3-phenylene-bis(1,2,3,4-tetrabromophthalimide, hexabromocyclododecane, 4-bromophenyl(1,2,3,4-tetrabromotetrabromophthalamide), pentabromobenzylacrylate, 1,6-bis(1,2,3,4-tetrabromo-phthalmido)hexane, 1,2-bis(1,2,3,4-tetrabromophthalmido)

ethane, dibromoethyl dibromocyclohexane, hexabromocyclododecane, tetrabromobisphenol-A, bis(2,3-dibromopropyl ether), tetrabromophthalic anhydride, Diels Alder adducts of chlorinated cyclopentadienes and diene derivatives such as cyclooctadiene, dechlorane, 1,3,5-tris(2, 4,6-tribromophenoxy)triazine, polybrominated diphenyl ethers, poly(2,6-dibromophenylene ether), brominated styrene monomers such as dibromostyrene, brominated polycarbonate, bis(tribromophenoxy)ethane, perbrominated bibenzyl, dibromoethylcyclohexane, decabromodiphenyl oxide brominated polystyrene, brominated cyclododecane, tetrabromobisphenol-A diglycidyl ether and oligomers thereof, bis(2-hydroxyethyl ether) of tetrabromobisphenol-A, bis(2-methacroyloxyethyl ether) of tetrabromobisphenol-A, dibromoneopentylglycol dimethacrylate, and the like, and combinations comprising at least one of the foregoing brominated derivatives. Preferred phosphorus-containing flame retardants include, for example, $C_6$–$C_{100}$ aromatic, $C_6$–$C_{100}$ aliphatic, or $C_6$–$C_{100}$ mixed aromatic-aliphatic phosphate esters such as, for example, triphenyl phosphate, tricresyl phosphate, triethyl phosphate, dimethyl methylphosphonate and aluminum and zinc salts thereof, tris(2-allylphenyl)phosphate, isopropylphenyl diphenylphosphate, tris(2-methoxy-4-allylphenyl)phosphate, tris(2-propenylphenyl)phosphate, tris(4-vinylphenyl)phosphate, bis(diphenylphosphate ester)s of bisphenols including bisphenol-A and resorcinol and hydroquinone, bis(diphenyl phosphoramide)s of diamines such as 1,6-hexanediamine and piperidine, and alkylated or substituted derivatives thereof. Other suitable flame retardants include melamine, cyclophosphazenes such as hexamino and hexaphenyl cyclophosphazenes and derivatives thereof, aluminum trihydrate, zinc borate, borax, tin oxide, zinc hydroxy stannate, zinc stannate, magnesium hydroxide, and hydromagnesite, huntite, molybdenum trioxide, zinc molybdate, calcium molybdate, ammonium molybdate, ferrous oxides, ferrocene, trischloroethylphosphate, dialkyl vinylphosphonates such as diethylvinylphosphonate, ammonium polyphosphate, melamine phosphonates, urea, red phosphorus, phosphorylated polyvinyl alcohol, and the like. If brominated flame retardants are used, it is preferred that the bromine content of the brominated flame retardant be greater than 30 weight percent, more preferably greater than 60 weight percent of the total of the capped poly(arylene ether), the alkenyl aromatic monomer, and the acryloyl monomer. The high bromine content of the flame retardant allows one to obtain UL-94 flammability and at the same time maintain high poly(arylene ether) content and optimal dielectric properties.

Synergists such as ferrous oxide, antimony oxide, and the like may be added to improve the flame retardancy of the desired composition.

Lubricants may include fatty alcohols and their dicarboxylic acid esters including cetyl, stearyl and tall oil alcohol, distearyl adipate, distearyl phthalate, fatty acid esters of glycerol and other short chain alcohols including glycerol monooleate, glycerol monostearate, glycerol 12-hydroxystearate, glycerol tristearate, trimethylol propane tristearate, pentaerythritol tetrastearate, butyl stearate, isobutyl stearate, stearic acids, 12-hydroxystearic acid, oleic acid armide, erucamide, bis(stearoyl)ethylene diamine, calcium stearate, zinc stearate, neutral lead stearate, dibasic lead stearate, stearic acid complex esters, oleic acid complex esters, calcium soap containing complex esters, fatty alcohol fatty acid esters including isotridecyl stearate, cetyl palmitate, stearyl stearate, behenyl behenate, montanic acid, montanic acid ethylene glycol esters, montanic acid glycerol esters, montanic acid pentaerythritol esters, calcium soap containing montanic acid esters, calcium montanate, sodium montanate; linear or branched polyethylene, partially saponified polyethylene wax, ethylene-vinyl acetate copolymer, crystalline polyethylene wax; natural or synthetic paraffin including fully refined wax, hardened paraffin wax, synthetic paraffin wax, microwax, and liquid paraffin; fluoropolymers including polytetrafluoroethylene wax, and copolymers with vinylidene fluoride.

The composition may further comprise one or more fillers, including low-aspect ratio fillers, fibrous fillers, and polymeric fillers. Examples of such fillers well known to the art include those described in "Plastic Additives Handbook, 5$^{th}$ Edition" Hans Zweifel, Ed, Carl Hanser Verlag Publishers, Munich, 2001. Non-limiting examples of fillers include silica powder, such as fused silica and crystalline silica; boron-nitride powder and boron-silicate powders for obtaining cured products having low dielectric constant and low dielectric loss tangent; the above-mentioned powder as well as alumina, and magnesium oxide (or magnesia) for high temperature conductivity; and fillers, such as wollastonite including surface-treated wollastonite, calcium sulfate (as its anhydride, dihydrate or trihydrate), calcium carbonate including chalk, limestone, marble and synthetic, precipitated calcium carbonates, generally in the form of a ground particulate which often comprises 98+% $CaCO_3$ with the remainder being other inorganics such as magnesium carbonate, iron oxide, and alumino-silicates; surface-treated calcium carbonates; talc, including fibrous, modular, needle shaped, and lamellar talc; glass spheres, both hollow and solid, and surface-treated glass spheres typically having coupling agents such as silane coupling agents and/or containing a conductive coating; and kaolin, including hard, soft, calcined kaolin, and kaolin comprising various coatings known to the art to facilitate the dispersion in and compatibility with the thermoset resin; mica, including metallized mica and mica surface treated with aminosilanes or acryloylsilanes coatings to impart good physicals to compounded blends; feldspar and nepheline syenite; silicate spheres; flue dust; cenospheres; fillite; aluminosilicate (armospheres), including silanized and metallized aluminosilicate; natural silica sand; quartz; quartzite; perlite; tripoli; diatomaceous earth; synthetic silica, including those with various silane coatings, and the like.

The above fillers may be used in metallized or silane coated forms to improve compatibility and adhesion with the thermoset blend.

Other mineral fillers include silicon carbide to increase the abrasive action of polymers; molybdenum sulfide to improve the lubricity, zinc sulfide to impart a white coloration; aluminum silicate (mullite), synthetic calcium silicate and zirconium silicate to improve slip properties; barium titanate to enhance dielectric properties; barium ferrite to produce magnetized polymers; and barium sulfate and heavy spar.

Other fillers include metals and metal oxides including particulate or fibrous aluminum, bronze, zinc, copper and nickel to improve, for example, thermal, electrical conductivity or resistance to neutron or gamma rays. Aluminum hydroxide may be incorporated to improve the flammability of a polymer resin.

Other fillers include carbon, such as carbon black for use as a potential colorant, and conductive carbon black to achieve improved volume conductivity and heat deflection temperature. Graphite, such as graphite powder may be used to impart lubricity and/or conductivity to the formulation.

Other fillers include flaked fillers and reinforcements such as glass flakes, flaked silicon carbide, aluminum diboride, aluminum flakes, and steel flakes.

Fibrous fillers include short inorganic fibers, including processed mineral fibers such as those derived from blends comprising at least one of aluminum silicates, aluminum oxides, magnesium oxides, and calcium sulfate hemihydrate.

Other fibrous fillers include natural fillers and reinforcements, such as wood flour obtained by pulverizing wood, and fibrous products such as cellulose, cotton, sisal, jute, starch, cork flour, lignin, ground nut shells, corn, rice grain husks.

Other fibrous fillers include synthetic reinforcing fibers, including polyesters such as polyethylene terephthalate, polyvinylalcohol; and high tenacity fibers with high thermal stability, including basalt fibers, carbon fibers, aromatic polyamide fibers, polybenzimidazole, polyimide fibers such as polyimide 2080 and PBZ fiber (both products of Dow Chemical Company, Midland, Mich. USA); and polyphenylene sulfide fiber, polyether ether ketone fibers, boron fibers, ceramic fibers such as silicon carbide, and fibers from mixed oxides of aluminum, boron and silicon sold under the trade name NEXTEL® by 3M Co., St. Paul, Minn., USA.

Also included among fibrous fillers are single crystal fibers or "whiskers" including silicon carbide, alumina, boron carbide, carbon, iron, nickel, copper.

Also included among fibrous fillers are glass fibers, including textile glass fibers such as E, A, C, ECR, R, S, D, and NE glasses and quartz.

In addition, organic reinforcing fibrous fillers may be used in the present invention including, organic polymers capable of forming fibers. Illustrative examples of such organic fibrous fillers include, for example, poly(ether ketone), polyimide, polybenzoxazole, poly(phenylene sulfide), polyesters, polyethylene, aromatic polyamides, aromatic polyimides or polyetherimides, polytetrafluoroethylene, acrylic resins, and poly(vinyl alcohol). Also included are natural organic fibers known to those skilled in the art, including cotton, cloth, hemp cloth, felt, and natural cellulosic fabrics such as Kraft paper, cotton paper and glass fiber containing paper.

Such reinforcing fillers may be provided in the form of monofilament or multifilament fibers and can be used either alone or in combination with other types of fiber, through, for example, co-weaving or core/sheath, side-by-side, orange-type or matrix and fibril constructions, or by other methods known to one skilled in the art of fiber manufacture. Typical cowoven structures include glass fiber-carbon fiber, carbon fiber-aromatic polyimide (aramid) fiber, and aromatic polyimide fiber-glass fiber. Fibrous fillers may be supplied in the form of, for example, rovings, woven fibrous reinforcements, such as 0–90 degree fabrics, non-woven fibrous reinforcements such as continuous strand mat, chopped strand mat, tissues, papers and felts and 3-dimensionally woven reinforcements, performs and braids.

For most applications fibrous reinforcements preferred are selected from the group consisting of E, S, D, and NE glass fibers and quartz, polyethylene terephthalate, basalt fibers, carbon fibers, polyethylene fiber, aromatic polyamide fibers, polybenzimidazole fiber, polyimide fibers, polyphenylene sulfide fiber, polyether ether ketone fibers, boron fibers, and ceramic fibers such as silicon carbide.

Fibrous fillers may also include vapor-grown carbon fibers include those having an average diameter of about 3.5 to about 500 nanometers as described in, for example, U.S. Pat. Nos. 4,565,684 and 5,024,818 to Tibbetts et al.; U.S. Pat No. 4,572,813 to Arakawa; U.S. Pat. No. 4,663,230 and 5,165,909 to Tennent; U.S. Pat. No. 4,816,289 to Komatsu et al.; U.S. Pat. No. 4,876,078 to Arakawa et al.; U.S. Pat. No. 5,589,152 to Tennent et al.; and U.S. Pat. No. 5,591,382 to Nahass et al.

Descriptions of various of fibrous fillers, their incorporation and utility may be found in Engineered Materials Handbook, Volume 1, Composites, ASM International Metals Park, Ohio, copyright 1987 Cyril A. Dostal Senior Ed.

When present, the fillers, including fibrous fillers, may be used in an amount of about 0.005 to about 1000 parts, preferably about 1 to about 500 parts, more preferably about 10 to about 250 parts, yet more preferably about 50 to about 200 parts, per 100 parts total of the capped poly(arylene ether), the alkenyl aromatic monomer, and the acryloyl monomer.

These aforementioned fillers may be added to the thermosetting resin without any treatment, or after surface treatment, generally with an adhesion promoter.

The formulation may also contain adhesion promoters to improve adhesion of the thermosetting resin to the filler or to an external coating or substrate. Also possible is treatment of the aforementioned inorganic fillers with adhesion promoter to improve adhesion. Adhesion promoters include chromium complexes, silanes, titanates, zirco-aluminates, propylene maleic anhydride copolymers, reactive cellulose esters and the like. Chromium complexes include those sold by DuPont under the tradename VOLAN®. Silanes include molecules having the general structure $(RO)_{(4-n)}SiY_n$ wherein n=1–3, R is an alkyl or aryl group and Y is a reactive functional group which can enable formation of a bond with a polymer molecule. Particularly useful examples of coupling agents are those having the structure $(RO)_3SiY$. Typical examples include, for example, vinyl-triethoxysilane, vinyl tris(2-methoxy)silane, gamma-methacryloxypropyl-trimethoxy silane, gamma-aminopropyltriethoxysilane, gamma-glycidoxypropyltrimethoxysilane, and gamma-mercaptopropyltrimethoxysilane. Titanates include those developed by S. J. Monte et al. in Ann. Chem. Tech Conf. SPI (1980), Ann. Tech Conf. Reinforced Plastics and Composite inst. SPI 1979, Section 16E, New Orleans; and S. J. Monte, Mod. Plastics Int. 14(1984) 6 pg. 2. Zirco-aluminates include those described by L. B. Cohen in Plastics Engineering 39 (1983) 11, pg. 29. The adhesion promoter may be included in the thermosetting resin itself, or coated onto any of the fillers described above to improve adhesion between the filler and the thermosetting resin. For example such promoters may be used to coat a silicate fiber or filler to improve adhesion of the resin matrix.

Polymeric fillers, including thermoplastics, rubbers, elastomers, and the like, may also be used. Examples of thermoplastics include powdery engineering resins, such as polycarbonate, thermoplastic polyester, polyestercarbonate, polyphenylene ether, polysulfone, polyether sulfone, and polyacrylate; powdery polyolefins, such as polyethylene, polypropylene and poly-4-methyl pentene-1; fluoroplastics, such as polytetrafluoroethylene, tetrafluoroethylene-propylene copolymer; chlorinated polyethylene; ethylene vinyl acetate copolymers; polyacrylates such as polybutyl acrylate, poly(2-hexyl acrylate); core-shell impact modifiers, such as polymethylmethacrylate-polybutylacrylate, poly(acrylonitrile-butadiene-styrene), poly(styrene-acrylonitrile) copolymers, poly (methylmethacrylate-butadiene-styrene) terpolymers; polyphenylene ether; ethylene propylene rubbers including diene modified ethylene propylene rubbers, and butadiene/styrene block copolymers. Polymeric fillers may also include organic fillers such as rubbers, including acrylate-butadiene rubber, copolymers of ethyl acrylate (or other acrylates) and a small amount of a monomer that facilitates vulcanization (acrylic rubber), terpolymer from tetrafluoroethylene, trifluoronitrosomethane, and nitrosoperfluorobutyric acid (nitroso rubber), ethylacrylate-acrylonitrile copolymer (acrylate rubber), alkylene sulfide rubber, urethane rubber based on polyester, butadiene rubber (polybutadiene), bromobutyl rubber, chlorobutyl rubber, polychlorotrifluoroethylene (fluoro rubber), chloropolyethylene, epichlorohydrin homopolymer rubber (polychloromethyloxiran), chloroprene rubber (polychloroprene), chlorosulfonylpolyethylene, ethylene-ethyl acrylate copolymer (e.g., those sold by DuPont under the tradename VAMAC®), copolymer of ethylene oxide (oxiran) and chloromethyloxiran (epichlorohydrin rubber), epoxidized natural rubber, ethylene-propylene-diene terpolymer, ethylene-propylene copolymer, urethane rubber based on polyether, epichlorohydrin-ethyleneoxide terpolymer, ethylene-vinylacetate copolymer, methyl silicone rubber with fluoro groups, rubber having fluoro or fluoroalkyl or fluoroalkoxy substituent groups on the polymer chain, copolymer from propylene oxide and allyl glycidyl ether, hydrogenated nitrile rubber, isobutylene-isoprene rubber (butyl rubber), polyisobutene, synthetic isoprene rubber, liquid silicone rubber, methyl silicone rubber, and acrylonitrile-butadiene rubber. Polymeric fillers further include functionalized polybutadiene and polybutadiene-acrylonitrile rubbers including those sold under the tradename HYCAR® by B.F. Goodrich Company, including, carboxy functionalized polybutadiene rubbers such as HYCAR® 2000X162CTB (Carboxyl Equivalents= 0.045; Mn=4,200; Carboxyl Equivalents per chain 1.9); HYCAR® CS 8596 (Carboxyl equivalents=0.032; Mn=6250; Carboxyl equivalents/chain=approx. 2), and carboxy terminated poly(butadiene-co-acrylonitrile) rubbers such as HYCAR® 1300X31CTBN (Acrylonitrile content= 10%; Carboxyl Equivalents=0.050; Mn=3,800; Carboxyl equivalents/chain=1.9); HYCAR® 1300X8 CTBN (Acrylonitrile content=18%; Carboxyl Equivalents=0.052; Mn=3,550; Carboxyl equivalents/chain=1.8) HYCAR® 1300X13 CTBN (Acrylonitrile content=26%; Carboxyl Equivalents=0.057; Mn=3,150; Carboxyl equivalents/chain=1.8); HYCAR® 1300X9CTBNX (Acrylonitrile content=18; Carboxyl Equivalents=0.067; Mn=3,600; Carboxyl equivalents/chain=2.4); HYCAR® 1300X18 CTBNX (Acrylonitrile content=21.5; Carboxyl Equivalents=0.070; Mn=3,400; Carboxyl equivalents/chain=2.4), vinyl and carboxy functionalized poly(butadiene-acrylonitrile) rubbers including HYCAR® 1300X33 VTBNX (Acrylonitrile content=18%; Carboxyl Equivalents per 100 rubber=0.009 maximum); HYCAR® 1300X43 VTBNX (Acrylonitrile content=21.5%; Carboxyl Equivalents per 100 rubber=0.009 maximum); epoxy terminated poly(butadiene-acrylonitrile) rubber HYCAR® 1300X40 ETBN (Carboxyl Equivalents per chain=0.027 maximum; 50% solution in styrene); amine terminated polybutadiene-acrylonitrile rubbers such as HYCAR® 1300X21ATBN (Acrylonitrile content=10%), 1300X16ATBN (Acrylonitrile content=18%); HYCAR® 1300X45 ATBN (Acrylonitrile content=18%); 1300X35ATBN (Acrylonitrile content=26%); HYCAR® 1300X42 ATBN (Acrylonitrile content=18%); also included are the functionalized polybutadienes and poly(butadiene-styrene) random copolymers sold by Ricon Resins, Inc. under the trade name RICON®, RICACRYL®, and RICOBOND® resins these include butadienes containing both low vinyl content such as RICON® 130, 131, 134, 142 polybutadienes containing high vinyl content such as RICON® 150, 152, 153, 154, 156, 157, and P30D; also random copolymers of styrene and butadiene including RICON® 100, 181, 184, and maleic anhydride grafted polybutadienes and the alcohol condensates derived therefrom such as RICON® 130MA8, RICON® MA13, RICON® 130MA20, RICON® 131MAS, RICON® 131MA10, RICON® MA17, RICON® MA20, RICON® 184MA6 and RICON® 156MA17; also include are polybutadienes which may be used to improve adhesion including RICOBOND® 1031, RICOBOND® 1731, RICOBOND® 2031, RICACRYL® 3500, RICOBOND® 1756, RICACRYL® 3500; also are included the polybutadienes RICON® 104 (25% polybutadiene in heptane), RICON® 257 (35% polybutadiene in styrene), and RICON® 257 (35% polybutadiene in styrene); also are included (meth) acrylic functionalized RICACRYL® 3100, RICACRYL® 3500, and RICACRYL® 3801. Also are included are powder dispersions of functional polybutadiene derivatives including, for example, RICON® 150D, 152D, 153D, 154D, P30D, RICOBOND® 1731HS, and RICOBOND® 1756HS. Further butadiene resins include poly(butadiene-isoprene) block and random copolymers, such as those with molecular weights from 3,000–50,000 AMU and polybutadiene homopolymers having molecular weights from 3,000–50, 000 AMU. Also included are polybutadiene, polyisoprene, and polybutadiene-isoprene copolymers functionalized with maleic anhydride functions, 2-hydroxyethylmaleic functions, or hydroxylated functionality. Polymeric fillers further include polyacrylonitrile-chloroprene, polyacrylonitrile-isoprene, polyisoprene, polyglycol ethers, such as polypropylene glycol, polyethylene glycol, polyethylene glycol-polypropylene glycol block and random copolymers, polytetrahydrofuran, polypropylene oxide-allylglycidyl ether copolymers, polyvinylpyridine-butadiene, polyethylene, and methyl silicone rubbers and fluids with vinyl or phenyl groups. Polymeric fillers may also include polyfluoroalkoxyphosphazene, polynorbornene, polypropylene, vinylpyridine-styrene-butadiene rubber, polyurethanes, methyl silicones with phenyl and vinyl groups, polystyrene-butadiene, styrene-butadiene-styrene block copolymer (thermoplastic elastomer), styrene-chloroprene rubber, polysiloxane treated EPDM, styrene-isoprene rubber, styrene-isoprene-styrene block copolymer (thermoplastic elastomer), polythioglycol ether, polytetrafluoroethylene, polysulfide rubbers, trans-polyoctenamer, trans-polypentenamer, thermoplastic polyurethanes, crosslinkable polyethylene, poly (vinylchloride-co-vinyl acetate-co acrylic acid), poly (ethylene-co-vinylacetate-co-acrylic acid).

Also included among polymeric fillers are electrically conductive polymers such as polypyrrole, polyaniline, polyphenylene, polyacetylene, and substituted derivatives there of, including derivatives substituted with $C_1$–$C_{25}$ alkyl, $C_1$–$C_{25}$ alkoxy, $C_2$–$C_{25}$ alkylcarbonyl, $C_2$–$C_{25}$ alkylcarbonyloxy, $C_6$–$C_{25}$ aryl, $C_6$–$C_{25}$ aryloxy, $C_7$–$C_{25}$ arylcarbonyl, and $C_7$–$C_{25}$ arylcarbonyloxy.

When present, the polymeric fillers may be used in amounts of about 0.005 to about 200 parts, preferably about 2 to about 30 parts, more preferably about 5 to about 25 parts, yet more preferably about 10 to about 20 parts, per 100 parts total of the capped poly(arylene ether), the alkenyl aromatic monomer, and the acryloyl monomer. The polymeric filler may or may not be reactive with the uncured composition and may or may not be soluble in the uncured or cured composition to which it is added.

The composition may, optionally, further comprise an electrically conductive agent, hereinafter referred to as a conductive agent. Suitable conductive agents include graphite, conductive carbon black, conductive carbon fibers, metal fibers, metal particles, particles of intrinsically conductive polymers, and the like. Suitable conductive carbon fibers include those having a length of about 0.25 inch and a diameter of about 7 micrometers. Suitable conductive carbon fibers also include agglomerates of fibers having an aspect ratio of at least 5 and an average diameter of about 3.5 to about 500 nanometers as described, for example, in U.S. Pat. Nos. 4,565,684 and 5,024,818 to Tibbetts et al.; U.S. Pat. No. 4,572,813 to Arakawa; U.S. Pat. No. 4,663,230 and U.S. Pat. No. 5,165,909 to Tennent; U.S. Pat. No. 4,816,289 to Komatsu et al.; U.S. Pat. No. 4,876,078 to Arakawa et al.; 5,589,152 to Tennent et al.; and U.S. Pat. No. 5,591,382 to Nahass et al. Suitable graphite particles may have an average particle size of about 20 to about 1,000 nanometers and a surface area of about 1 to about 100 $m^2/g$. Examples of suitable carbon blacks include particles of carbon having an average primary particle diameter of less than about 125 nanometers, more preferably less than about 60 nanometers. The carbon black is preferably utilized as an aggregate or agglomerate of primary particles, the aggregate or agglomerate typically having a size about 5 to about 10 times the primary particle size. Larger agglomerates, beads, or pellets of carbon particles may also be utilized as a starting material in the preparation of the composition, so long as they disperse during the preparation or processing of the composition sufficiently to reach an average size in the cured composition of less than about-10 microns, more preferably less than about 5 microns, and more preferably less than about 1.25 microns. Suitable intrinsically conductive polymers include polyanilines, polypyrroles, polyphenylene, polyacetylenes, and the like.

The amount of the conductive agent will vary according to the identity of the conductive agent and the conductivity requirements of the article comprising the composition. Selection of a conductive agent amount may be made by those of ordinary skill in the art. For example, when the conductive agent is graphite and the composition is used to form a bipolar plate for a fuel cell, the conductive agent may be present in an amount of about 5 weight percent to about 95 weight percent, based on the total weight of the composition. Within this range, it may be preferred to use a graphite amount of at least about 10 weight percent, more preferably at least about 20 weight percent, yet more preferably at least about 30 weight percent. Also within this range, it may be preferred to use a graphite amount of up to about 90 weight percent, more preferably up to about 80 weight percent, yet more preferably up to about 70 weight percent, based on the total weight of the composition. As another example, when the composition is used to form a bipolar plate and the conductive agent is conductive carbon fibers having an aspect ratio of at least 5 and an average diameter of about 3.5 to about 500 nanometers, the carbon fibers may be present in an amount of about 0.1 to about 10 weight percent, based on the total weight of the composition. Within this range, a carbon fiber amount of at least about 1 weight percent may be preferred. Also within this range, a carbon fiber amount up to about 5 weight percent may be preferred.

It is expressly contemplated to provide at least a portion of the conductive agent in the form of the cured, ground composition. For example, an article consisting of the cured composition with 80 weight percent graphite may be recycled by grinding it into a powder and using the powder to provide at least a portion of the graphite in the preparation of a new batch of the curable composition.

Additives may also include blowing agents such as azo compounds like diazoaminobenzene, azobisisobutyronitrile, azodicarbonamide, azodicarbonic acid, benzene sulfonyl hydrazide, benzene-1,3-disulfonylhydrazide, diphenyloxide-4,4'-disulfonylhydrazide, p-toluenesulfonic acid hydrazide, N,N'-dinitrosopentamethylenetetraamine, N,N-dimethyl-N,N'-dinitrosophthalamide, and sodium carbonate blends with acidic compounds such as tartaric acid, and the like.

In a preferred embodiment, the composition is substantially free of water, meaning that the composition comprises water in an amount less than about 1 weight percent, preferably less than about 0.5 weight percent, more preferably less than about 0.1 weight percent, based on the total weight of the composition.

The curable compositions may be dissolved in an effective amount of an inert organic solvent, typically to a solute content of about 30%–60% by weight. The identity of the solvent is not critical, provided that it may be removed by suitable means such as evaporation. Aromatic hydrocarbons, especially toluene, are preferred. The order of blending and dissolution also is not critical. However, in order to avoid premature curing, catalyst and hardener components generally should not be brought initially into contact with uncapped poly(arylene ether) and polymerizable monomer composition at a temperature above about 60° C. Proportions of components herein do not include solvent unless otherwise indicated.

There is no particular limitation on the method by which the composition is prepared. The composition may be prepared by forming an intimate blend of the capped poly (arylene ether), the alkenyl aromatic monomer, and the acryloyl monomer. Alternatively, the composition may be prepared directly from an uncapped poly(arylene ether) by dissolving the uncapped poly(arylene ether) in a portion of the alkenyl aromatic monomer, adding a capping agent to form the capped poly(arylene ether) in the presence of the alkenyl aromatic monomer, and adding the acryloyl monomer, and any other components to form the thermoset composition. The composition may also be formed by dispersing particulate capped poly(arylene ether) in the other components, where the particulate (i.e., powder) preferably has a particle size of about 0.5 to about 300 micrometers.

There is no particular limitation on the method by which the composition may be cured. The composition may, for example, be cured thermally or by using irradiation techniques, including UV irradiation and electron beam irradiation. When heat curing is used, the temperature selected may be about 80° C. to about 300° C., and preferably about 120° C. to about 240° C. The heating period may be about 1 minute to about 10 hours, though such heating period may advantageously be about 1 minute to about 6 hours, more preferably about 3 hours to about 5 hours. Such curing may be staged to produce a partially cured and often tack-free resin, which then is fully cured by heating for longer periods or temperatures within the aforementioned ranges.

The cured composition may preferably exhibit a glass transition temperature of at least about 100° C., more preferably 120° C., yet more preferably at least about 130° C., still more preferably at least about 140° C.

The cured composition may preferably exhibit a coefficient of thermal expansion (CTE) below its glass transition temperature of not greater than about 30 micrometer/meter-° C. ($\mu$m/m-° C.), preferably not greater than about 25 $\mu$m/m-° C., more preferably not greater than about 20 $\mu$m/m-° C.

The cured composition may preferably exhibit of Claim 1 a fracture toughness measured according to ASTM D5045 of at least about 1.5 Mpa-m$^{1/2}$, preferably at least about 2.0 Mpa-m$^{1/2}$, more preferably at least about 2.5 Mpa-m$^{1/2}$, still more preferably at least about 3.0 Mpa-m$^{1/2}$, even more preferably at least about 3.5 Mpa-m$^{1/2}$.

Processes useful for processing the composition include those generally known to the art for the processing of thermosetting resins. Such processes have been described in the literature as in, for example, Engineered Materials Handbook, Volume 1, Composites, ASM International Metals Park, Ohio, copyright 1987 Cyril A. Dostal Senior Ed, pp. 105–168 and 497–533, and "Polyesters and Their Applications" by Bjorksten Research Laboratories, Johan Bjorksten (pres.) Henry Tovey (Ch. Lit. Ass.), Betty Harker (Ad. Ass.), James Henning (Ad. Ass.), Reinhold Publishing Corporation, New York, 1956. Processing techniques include resin transfer molding; sheet molding; bulk molding; pultrusion; injection molding, including reaction injection molding (RIM); atmospheric pressure molding (APM); casting, including centrifugal and static casting open mold casting; lamination including wet or dry lay up and spray lay up; also included are contact molding, including cylindrical contact molding; compression molding; including vacuum assisted resin transfer molding and chemically assisted resin transfer molding; Seeman's Composite Resin Infusion Manufacturing Processing (SCRIMP); open molding, continuous combination of resin and glass; and filament winding, including cylindrical filament winding.

A sheet molding compound may comprise for example 1) about 15 to about 45 parts by weight of a methacrylate-capped poly(arylene ether); 2) about 40 to about 65 parts by weight of an alkenyl aromatic monomer; 3) about 5 to about 25 parts by weight of an acryloyl monomer; 4) about 0.25 to about 4 parts by weight of a curing catalyst, preferably an azo or peroxide compound such that the total parts of the components 1–4 equal 100 parts; 5) about 100 to about 250 parts of a filler; and 6) about 10 to about 400 parts of a fibrous filler, preferably about 1" chopped fibrous filler, more preferably 1" chopped glass fiber. The sheet molding compound may further comprise 7) about 2 to about 20 parts of a polymeric filler. The sheet molding compound may be cured by heating at temperatures of about 120° C. to about 170° C., preferably about 130° C. to about 160° C., under pressures of about 100 to about 5,000 psi and preferably from about 500 to about 3,000 psi. An uncured sheet molding compound may be also cured by means of electron beam or UV irradiation, or a combination of these processes.

An injection molding composition may comprise 1) about 15 to about 45 parts by weight of a methacrylate-capped poly(arylene ether); 2) about 40 to about 65 parts by weight of an alkenyl aromatic monomer; 3) about 5 to about 25 parts of an acryloyl monomer, preferably an acryloyl monomer containing 2, 3, 4, or 5 acryloyl groups per molecule; 4) about 0.25 to about 4 parts by weight of a curing catalyst, preferably an azo or peroxide compound; such that the total of the components 1–4 equal 100 parts by weight; 5) about 100 to about 250 parts by weight of a filler; and 6) about 10 to about 400 parts by weight of a fibrous filler, preferably about 1" chopped fibrous filler, and more preferably about 1" chopped glass fiber. The injection molding composition may further comprise 7) about 2 to about 20 parts of a polymeric filler. The injection molding composition may be cured by heating at temperatures of about 120° C. to about 170° C., preferably about 130° C. to about 160° C., under pressures of about 100 to about 5,000 psi, preferably about 500 to about 3,000 psi.

A bulk molding compound may comprise, for example, 1) about 15 to about 45 parts by weight a methacrylate-capped poly(arylene ether); 2) about 40 to about 65 parts by weight of an alkenyl aromatic monomer; 3) about 5 to about 25 parts by weight of an acryloyl monomer; 4) about 0.25 to about 4 parts by weight of a curing catalyst, preferably an azo or peroxide compound, such that the total of components 1–4 equals 100 parts by weight; 5) about 100 to about 250 parts by weight of a filler; and 6) about 10 to about 400 parts by weight of a fibrous filler, preferably about 1" chopped fibrous filler, more preferably chopped glass, graphite, or aramid fiber or a combination thereof, typically 1/8"–2" in length. The bulk molding compound may further comprise 7) about 2 to about 20 parts by weight of a polymeric filler. The bulk molding compound may be cured by heating the composition at a temperatures of about 120° C. to about 170° C., preferably about 130° C. to about 160° C., under a pressure of about 100 to about 5,000 psi, preferably about 500 to about 3,000 psi. An uncured bulk molding compound may be also cured by means of electron beam or UV irradiation, or a combination of these processes.

A resin transfer molding composition may be used to produce a cured article. Such a composition may comprise, for example, 1) about 10 to about 45 parts by weight of a methacrylate-capped poly(arylene ether); 2) about 40 to about 65 parts by weight of an alkenyl aromatic monomer; 3) about 5 to about 25 parts by weight of an acryloyl monomer, preferably an acryloyl monomer containing 2, 3, 4, or 5 acryloyl groups per molecule; 4) about 0.5 to about 4 parts by weight of a curing catalyst, preferably an azo or a peroxide compound; such that the total of components 1–4 equals 100 parts by weight; and 5) about 10 to about 800 parts of a fibrous filler, preferably glass, graphite, aramid, or ceramic, or a combination thereof. The composition may further comprise 6) about 5 to about 250 parts by weight of a filler and further may contain 7) about 1 to about 20 parts by weight of a polymeric filler. Curing of the composition may utilize a pressure of about 100 to about 5,000 psi and an energy source including heat, electron beam irradiation, UV irradiation, or a combination comprising at least one of the foregoing sources.

A pultrusion composition may comprise, for example, 1) about 10 to about 45 parts by weight of a methacrylate-capped poly(arylene ether); 2) about 40 to about 65 parts by weight of an alkenyl aromatic monomer; 3) about 5 to about 25 parts by weight of a multifunctional acrylate; 4) about 0.5 to about 4 parts by weight of a curing catalyst, preferably a peroxide, such that the total of components 1–4 equals 100 parts by weight; and 5) about 10 to about 400 parts by weight of a fibrous filler, preferably continuous glass, carbon, or aramid fiber, or a combination thereof. The pultrusion composition may further comprise 6) about 1 to about 20 parts by weight of a polymeric filler and/or 7) about 5 to about 250 parts by weight of a filler.

A filament wound article may be produced from a composition comprising 1) about 15 to about 45 parts by weight of a methacrylate-capped poly(arylene ether); 2) about 40 to about 65 parts by weight of an alkenyl aromatic monomer; 3) about 5 to about 25 parts by weight of an acryloyl monomer having 2, 3, 4, 5, or more acryloyl groups; 4) about 0.5 to about 4 parts by weight of a peroxide curing agent. The composition for filament winding may further comprise 5) about 1 to about 20 parts by weight of a polymeric filler and/or 7) about 5 to about 250 parts of a filler. This composition for filament winding may be impregnated into 6) about 10 to about 500 parts by weight of a fibrous filler, preferably glass, carbon, or aramid fibers, or a combination thereof.

A compression molding composition may comprise, for example, 1) about 15 to about 45 parts by weight of a methacrylate-capped poly(arylene ether); 2) about 40 to about 65 parts by weight of an alkenyl aromatic monomer; 3) about 5 to about 25 parts by weight of an acryloyl monomer having 2, 3, 4, 5, or more acryloyl groups; 4) about 0.5 to about 4 parts by weight of a peroxide curing agent; wherein the total of components 1–4 is 100 parts by weight; 5) about 5 to about 800 parts by weight of a filler. The compression molding composition may further comprise 6) about 1 to about 20 parts by weight of a polymeric filler and/or 7) about 10 to about 500 parts of a fibrous filler.

Another compression molding composition may comprise 1) about 15 to about 45 parts by weight of a methacrylate-capped poly(arylene ether); 2) about 40 to about 65 parts by weight of an alkenyl aromatic monomer; 3) about 5 to about 25 parts by weight of an acryloyl monomer having 2, 3, 4, 5, or more acryloyl groups; 4) about 0.5 to about 4 parts by weight of a peroxide curing agent; wherein the total of components 1–4 is 100 parts by weight. The compression molding composition may further comprise 5) about 10 to about 800 parts by weight of a fibrous filler and/or 6) about 1 to about 20 parts by weight of a polymeric filler and/or and 7) about 5 to about 250 parts of a filler.

A spray-layup process may be used to produce a cured article. In such a process fiber is chopped in a hand-held gun and fed into a spray of catalyzed resin directed at the mould. The deposited materials are left to cure under standard atmospheric conditions. A spray lay-up composition may comprise, for example, 1) about 15 to about 45 parts by weight of a methacrylate-capped poly(arylene ether); 2) about 40 to about 65 parts by weight of an alkenyl aromatic monomer; 3) about 5 to about 25 parts by weight of an acryloyl monomer having 2, 3, 4, 5, or more acryloyl groups; 4) about 0.5 to about 4 parts by weight of a curing catalyst, preferably a peroxide blended with a transition metal salt and an amine as described above; wherein the total of components 1–4 is 100 parts by weight. The spray lay-up composition may further comprise 5) about 1 to about 20 parts by weight of a polymeric filler and/or 6) about 5 to about 100 parts by weight of a filler. Such a composition may be combined by spraying into a spray of 10–500 parts by weight of a chopped fibrous filler, preferably glass and more preferably E-glass.

The inventive composition may be used to impregnate fibrous reinforcement clad with copper to form an electrical circuit boards offering excellent dielectric and thermal properties, and accelerated rates of polymerization in formation of the poly(arylene ether) compositions. Moreover, such poly(arylene ether) compositions may also be flame-retardant.

Molding compositions and laminate compositions are only a few of the many potential applications possible for the composition. Potential applications for the use of the composition include those known to the art for thermoplastics and thermosetting resins, particularly those having properties such as high Tg, toughness, excellent dielectric properties, and good flow properties.

Further contemplated is the curing of fiber-reinforced compositions such that they are adhered to the surface of other materials to form composite articles. Such composite articles, having, for example, honeycomb and foam structures, may be found in Engineered Materials Handbook, Volume 1, Composites, ASM International Metals Park, Ohio, copyright 1987 Cyril A. Dostal Senior Ed., pages 722–728. Thus, by curing of the inventive composition in contact with other materials more complex structures may be formed. Such other materials include foams such as PVC foam, polystyrene foam, polyurethane foam, polypropylene foam, polyethylene foam, and the like; wood including balsa, cedar, and the like; and materials such as CORE-MAT® or SPHERETEX®, which are materials consisting of a low density felt-like resins filled with low density microspheres. Also, the compositions may be cured onto the surface of honeycomb structures comprised of organic resins such as polyimides, including NOMEX®, metals such as aluminum, or the like.

Applications include, for example, acid bath containers; neutralization tanks; aircraft components; bridge beams; bridge deckings; electrolytic cells; exhaust stacks; scrubbers; sporting equipment; stair cases; walkways; automobile exterior panels such as hoods and trunk lids; floor pans; air scoops; pipes and ducts, including heater ducts; industrial fans, fan housings, and blowers; industrial mixers; boat hulls and decks; marine terminal fenders; tiles and coatings; building panels; business machine housings; trays, including cable trays; concrete modifiers; dishwasher and refrigerator parts; electrical encapsulants; electrical panels; tanks, including electrorefining tanks, water softener tanks, fuel tanks, and various filament-wound tanks and tank linings; furniture; garage doors; gratings; protective body gear; luggage; outdoor motor vehicles; pressure tanks; printed circuit boards; optical waveguides; radomes; railings; railroad parts such as tank cars; hopper car covers; car doors; truck bed liners; satellite dishes; signs; solar energy panels; telephone switchgear housings; tractor parts; transformer covers; truck parts such as fenders, hoods, bodies, cabs, and beds; insulation for rotating machines including ground insulation, turn insulation, and phase separation insulation; commutators; core insulation and cords and lacing tape; drive shaft couplings; propeller blades; missile components; rocket motor cases; wing sections; sucker rods; fuselage sections; wing skins and flairings; engine narcelles; cargo doors; tennis racquets; golf club shafts; fishing rods; skis and ski poles; bicycle parts; transverse leaf springs; pumps, such as automotive smog pumps; electrical components, embedding, and tooling, such as electrical cable joints; wire windings and densely packed multi-element assemblies; sealing of electromechanical devices; battery cases; resistors; fuses and thermal cut-off devices; coatings for printed wiring boards; casting items such as capacitors, transformers, crankcase heaters; small molded electronic parts including coils, capacitors, resistors, and semiconductors; as a replacement for steel in chemical processing, pulp and paper, power generation, and wastewater treatment; scrubbing towers; pultruded parts for structural applications, including structural members, gratings, and safety rails; swimming pools, swimming pool slides, hot-tubs, and saunas; drive shafts for under the hood applications; dry toner resins for copying machines; marine tooling and composites; heat shields; submarine hulls; prototype generation; development of experimental models; laminated trim; drilling fixtures; bonding jigs; inspection fixtures; industrial metal forming dies; aircraft stretch block and hammer forms; vacuum molding tools; flooring, including flooring for production and assembly areas, clean rooms, machine shops, control rooms, laboratories, parking garages, freezers, coolers, and outdoor loading docks; electrically conductive compositions for antistatic applications; for decorative flooring; expansion joints for bridges; injectable mortars for patch and repair of cracks in structural concrete; grouting for tile; machinery rails; metal dowels; bolts and posts; repair of oil and fuel storage tanks, and numerous applications in which a structural or dielectric resin or composite such as an polyester, vinyl ester, allylic, epoxy, cyanate ester, or polyphenylene ether resin or blend may be used.

The invention is further illustrated by the following non-limiting examples.

General Experimental

For the following Examples, the poly(2,6-dimethylphenyl ether) (PPE) was obtained from the General Electric Company. Calcium carbonate was obtained from Omya Corporation as OMYACARB® 5. Glass, either as continuous glass mat or chopped ½ inch fibers, was obtained from Owens Corning Fiberglass Corporation. All reagents were obtained from Aldrich Chemical Company unless otherwise specified. Gel permeation chromatography (GPC) was performed using a Waters Gel Permeation Chromatograph with a bank of PHENOMENEX® Phenogel $10^5$, $10^4$, and 500 Angstrom columns. A polymer solution (100 ml, approximately 0.3% by weight) was injected and the polymer eluted from the column using a chloroform solvent containing 0.5% ethanol at a flow rate of 1.5 ml/min. Elution was monitored using a UV detector set at 254 nm. The columns were calibrated using polystyrene standards (2,030 to 860,000 g/mol). $^1$H-NMR spectra were collected on a GE QE-300 MHz NMR spectrometer using CDCl$_3$ solvent and a tetramethylsilane (TMS) internal standard. Methacrylic endcap concentration ([MAA]) was determined by $^1$H-NMR analysis by comparison of the integrals of the methacrylic vinyl hydrogens to those of the aromatic hydrogens of the PPE repeat unit. $^{31}$P-NMR spectra were recorded on a GE GN-500 MHz spectrometer with hydroxyl endgroup concentration ([OH]) performed as described by P. Chan, D. S. Argyropolis, D. M. White, G. W. Yeager, and A. S. Hay, *Macromolecules,* 1994, volume 27, pages 6371 ff. Intrinsic viscosity (IV) measurements were performed at 25° C. from chloroform solutions using an Ubbelohde viscometer.

Resin Transfer molded samples were prepared using a Radius FlowWare RTM 2100 Injector, and the resin injected to a 10"×10"×0.125" plaque mold under 200 psi pressure. The glass transition temperatures ($T_g$) and coefficients of thermal expansion (CTE) were determined according to ASTM D6341. Decomposition onset temperatures in nitrogen and air were measured by thermogravimetric analysis (TGA) by placing resin samples of approximately 3 mm$^3$ in size in a platinum pan and performing the test using a TA Instruments TGA2950 run at atmospheric pressure under a constant flow (60 ml/min) of nitrogen or air. The temperature was increased at 20° C./min from 30 to 700° C.

Flexural modulus and flexural strength values were measured according to ASTM D6272. Fracture toughness (K1c) was measured according to ASTM 5045. Morphology was determined by transmission electron microscopy (TEM). Transmission electron micrographs (TEMs) were obtained on specimens sectioned with a diamond knife on an ultramicrotome. The sections were stained using RuO$_4$ vapor and micrographs were taken on a Philips CM1000 TEM operated at 100 KeV. Dynamic Mechanical Analysis (DMA) was performed using a Rheometrics Dynamic Spectrometer 7700. Samples having approximate dimensions of 3.2×64×13 mm were analyzed from 25 to 230° C., at a heating rate of 5° C./min. Samples approximately 3.2×64×13 mm in size were first notched and then a sharp crack was initiated with a razor blade. Load to failure was determined using an Instron 8500 Plus servo-hydraulic test instrument. Flexural Properties were determined in accordance with ASTM D790. Dielectric constants (D$_k$) and dissipation factors (D$_f$) were measured according to ASTM D150-95.

PREPARATIVE EXAMPLES 1–4

To a solution of 3 L of toluene in a 5-liter 3-necked round bottom flask was added 1500 g of poly(2,6-dimethylphenyl ether) resin (intrinsic viscosity=0.15 dl/g), 153 g (1.0 mol) of methacrylic anhydride, and 121 g (1.0 mol) of dimethylaminopyridine. The solution was heated at reflux overnight. The desired product was precipitated into methanol and isolated by filtration. The resulting product was dried at 80° C. overnight in vacuo. The yield of product was 1333 g. $^{31}$P-NMR (CDCl$_3$; 2,3-dioxaphospholane). No detectable PPE-OH groups (i.e., less than 5 micromoles of hydroxyl groups, —OH, per gram of the poly(arylene ether)). $^1$H-NMR (CDCl$_3$, TMS): 2.07 (s, 6H; PPE CH$_3$); 2.18 (s, 3H, methacrylate CH$_3$); 5.74 (s, 2H, methacrylate CH$_2$); 6.46 (s, 2H PPE Ar—H); 7.08 (m, 3H, PPE tail endgroup).

Using the procedure described above, three different molecular weight poly(2,6-dimethylphenyl ether) resins were capped with methacrylic anhydride (MAA-capped PPE for brevity).

Preparative Example 4 corresponds to a poly(salicylate)-capped poly(arylene ether)/styrene blend. Using the procedure from Example 3 of U.S. Pat. No. 4,760,118 to White et al., a poly(salicylate)-capped polyphenylene ether was prepared from poly(2,6-dimethylphenyl ether) having an intrinsic viscosity of 0.25 dl/g and 10 weight percent (based on poly(arylene ether)) polysalicylate. The product capped poly (arylene ether) was dissolved in styrene as a 35 weight percent solution for use as Preparative Example 4.

The properties of the resins are listed below in Table 1.

TABLE 1

|  | Prep. Ex. 1 | Prep. Ex. 2 | Prep. Ex. 3 | Prep. Ex. 4 |
|---|---|---|---|---|
| IV before capping (dl/g) | 0.12 | 0.15 | 0.25 | 0.25 |
| Mw (AMU) | 7,600 | 11,600 | 31,400 | 36,000 |
| Mn (AMU) | 4,600 | 6,100 | 17,700 | 14,900 |
| Dispersity | 1.66 | 1.91 | 1.78 | 2.4 |
| Tg (° C., DSC) | 153.4 | 169.6 | 202.0 | 215.0 |
| [capping group] (µmol/g) | 349.8 | 271.1 | 136.3 | 48.7 |
| [OH] (µmol/g) | <5 | <5 | <5 | <5 |

PREPARATIVE EXAMPLE 5

This example describes the preparation of methacrylate-capped poly(arylene ether)/styrene blend derived from an uncapped poly(arylene ether) having an intrinsic viscosity of 0.15 dL/g in chloroform at 25° C.

A 22-liter 3-necked round-bottomed flask was charged with 8 kg (17.6 lbs) of styrene monomer (Ashland Chemical; Lot # 074B00508). The solution was warmed to 85° C. with constant stirring. During this time 8 kg (17.06 lbs) of 0.15 IV PPE (GEP-Selkirk) was added. After addition was complete, the reaction mixture was stirred at 85° C. for approximately 1 hour until the resin had dissolved. The reaction mixture was then treated with 936.2 g of N,N-dimethylaminopyridine (DMAP, Avocado Labs, Inc.) and 958 g (925 ml, d=1.035 g/ml) of methacrylic anhydride (Monomer-Polymer Dajac Labs) then heated at 85° C. for 300 minutes. The reaction mixture was then cooled and the resin mixture emptied into a 5 gallon container. A small sample was precipitated into methanol and submitted for analysis. Both the precipitated sample and the PPE/Styrene mixture were analyzed. Precipitated PPE sample: $^{31}$P-NMR (CDCl$_3$; 2,3-dioxaphospholane/pyridine functionalized): δ=128.30 ppm (BPA internal std., Concentration=1000 ppm); δ=129.53 ppm (residual methacrylate $CO_2H/CO_2^-$; concentration=339 ppm); No detectable PPE-OH groups. GPC: PPE retention time=22.97 minutes; Mw=10,906, Mn=6842, Mw/Mn=1.4; DSC: 167.4° C.; TGA % residue at 700° C.=28.8%; Weight Loss at 400° C.=2.1%; Decomposition Onset=459.7° C. $^1$H-NMR (CDCl$_3$, TMS): $^1$H-NMR (CDCl$_3$, TMS): 2.07 (s, 6H; PPE CH$_3$); 2.18 (s, 3H, methacrylate CH$_3$); 5.74 (s, 2H, methacrylate CH$_2$); 6.46 (s, 2H PPE Ar—H); 7.08 (m, PPE Tail endgroup).

PPE/Styrene Mixture: $^{31}$P-NMR (CDCl$_3$; 2,3-dioxaphospholane/pyridine functionalization): δ=128.30 ppm (BPA internal std., Concentration=1000 ppm); δ=129.52 ppm (residual methacrylate $CO_2H/CO_2^-$; Concentration 20978 ppm); Broad resonance at 130.7–131.5 (unidentified, not observed in precipitate sample; Concentration=4284 ppm), 128.50 ppm (unidentified, not observed in precipitate sample; Concentration=461 ppm).

No detectable PPE-OH groups. GPC: PPE retention time= 23.00 minutes $M_w$=10,736, $M_n$=6,818, $M_z$=17,055, $M_w/M_n$= 1.6; styrene retention time=30.32 minutes.

PREPARATIVE EXAMPLES 6–9

Preparative Example 6 describes the preparation of Methacrylate-capped 0.12 IV PPE Resin/Styrene blend.

A 100-gallon stainless steel reactor was charged with 68.03 kg (150 lbs) of Styrene monomer (Ashland Chemical; Lot # 074B00508). The solution was warmed, under a nitrogen blanket, from 39–79° C. over 75 minutes. During this time, 68.03 kg (150 lbs) of 0.12 IV PPE resin was added. After addition was complete the reaction mixture was stirred at 74–85° C. for 85 minutes to ensure dissolution of the PPE resin. The reaction mixture was then treated with 936.2 g of N,N-dimethylaminopyridine (DMAP, Avocado Labs, Inc). After 20 minutes, 8.156 kg (7.88 liters, d=1.035 g/ml) of methacrylic anhydride (Monomer-Polymer Dajac Labs) was added. The reaction mixture was heated at 85° C. for 305 minutes. The reaction was then cooled to approximately 50° C. and the resin mixture drained into ten 5-gallon containers. Yield: 143.35 kg (145.15 kg theoretical, 99%) of resin solution. GPC: PPE retention time=23.65 minutes; Mw=7532, Mn=5390, Mw/Mn=1.4; Residual styrene retention time=29.82 minutes. DSC: Tg=141.3° C.; TGA % residue at 700° C.=25.0%; Weight Loss at 400° C.=5.2%; Decomposition Onset=450.8° C.

PPE/Styrene Mixture: $^{31}$P-NMR (CDCl$_3$; 2,3-dioxaphospholane/pyridine functionalization): δ=128.30 ppm (BPA internal std., Concentration=1000 ppm); δ=129.53 ppm (residual methacrylate $CO_2H/CO_2^-$; Concentration=6571 ppm); Broad resonance at 130.7–131.5. (unidentified, not observed in ppt. sample; Concentration=692 ppm); δ=128.50 ppm (unidentified, not observed in ppt. sample; Concentration=437 ppm). No detectable PPE-OH groups. GPC: PPE retention time=23.67 minutes $M_w$=7442, $M_n$=5355, MP=5653, $M_z$=11,113, $M_w/M_n$=1.4; Styrene retention time=30.30 minutes.

Using the procedure described above, four different molecular weight poly(2,6-dimethylphenyl ether) resins were capped with methacrylic anhydride (MAA-capped PPE for brevity). Acetate-capped PPEs were prepared by substituting acetic anhydride for methacrylic anhydride in the above procedure. The properties of the resins are listed below in Table 2. Weight-average molecular weight (Mw) and number-average molecular weight (Mn) were determined by gel permeation chromatography. The abbreviation "Psal" means poly(salicylate).

TABLE 2

|  | Prep. Ex. 4 | Prep. Ex. 5 | Prep. Ex. 6 | Prep. Ex. 7 | Prep. Ex. 8 | Prep Ex. 9 |
| --- | --- | --- | --- | --- | --- | --- |
| IV before capping (dl/g) | 0.25 | 0.12 | 0.15 | 0.25 | 0.30 | 0.25 |
| Capping Agent | Psal | MAA | MAA | MAA | MAA | AA |
| capped PPE conc. in styrene (wt %) | 35 | 50 | 50 | 35 | 35 | 35 |
| Mw (AMU) | 31,000 | 7,500 | 10,900 | 31,400 | 36,000 | 31,000 |
| Mn (AMU) | 18,000 | 5,400 | 6,800 | 18,000 | 15,000 | 18,000 |
| Dispersity | 1.72 | 1.66 | 1.91 | 1.78 | 2.40 | 1.72 |
| [OH] (μmol/g) | — | <5 | <5 | <5 | <5 | <5 |

MAA = Methacrylic Anhydride
AA = Acetic Anhydride

EXAMPLES 1–4

In Examples 1–3, cured resin compositions of were prepared by first dissolving the methacrylate-capped poly (arylene ether)s (MAA-capped PPEs) described in Preparative Examples 1–3 in the alkenyl aromatic monomer, styrene, at from 80° C. and 140° C. with vigorous stirring, followed by cooling the solution to approximately 70° C. and adding the acryloyl monomer and catalyst. The solution was then resin transfer molded as described above and cured at 100° C. for 4 hours. Example 4 was processed in the same way with the exception that calcium carbonate was added to the solution after addition of the acryloyl monomer and the resin, transfer molded into a tool containing 4 plies of OCF 8610 continuous glass fiber mat. Compositions and test results are shown in Table 3. All amounts are parts by weight.

TABLE 3

|  | Ex. 1 | Ex. 2 | Ex. 3 | Ex. 4 |
| --- | --- | --- | --- | --- |
| Capped PPE: |  |  |  |  |
| Prep. Ex. 1 | 42.08 | 0 | 0 | 14.31 |
| Prep. Ex. 2 | 0 | 42.08 | 0 | 0 |
| Prep. Ex. 3 | 0 | 0 | 42.08 | 0 |
| Alkenyl aromatic monomer: |  |  |  |  |
| Styrene | 42.08 | 42.08 | 42.08 | 14.31 |

TABLE 3-continued

|  | Ex. 1 | Ex. 2 | Ex. 3 | Ex. 4 |
|---|---|---|---|---|
| Acryloyl monomer: | | | | |
| Trimethylolpropane triacrylate | 14.85 | 14.85 | 14.85 | 5.05 |
| Cure Catalyst: | | | | |
| t-butylperoxybenzoate | 0.99 | 0.99 | 0.99 | 0.33 |
| Filler: | | | | |
| 5 μm $CaCO_3$, (Omyacarb 5, Omya Corporation) | 0 | 0 | 0 | 50.00 |
| Continuous Fiber Glass Mat (OCF 8610) | 0 | 0 | 0 | 16.00 |
| Properties: | | | | |
| Tg (° C., TMA) | 155.80 | 151.90 | 166.60 | 158.20 |
| CTE below Tg (μm/m-° C.) | 7.14 | 7.49 | 6.81 | 4.22 |
| CTE above Tg (μm/m-° C.) | 22.90 | 22.30 | 19.50 | 30.00 |
| Decomposition Onset (° C., TGA, $N_2$) | 449.10 | 443.20 | 444.8.20 | 425.00 |
| Decomposition Onset (° C., TGA, Air) | 444.40 | 441.60 | 446.70 | 361.00 |
| Flexural Modulus (kpsi) | 353.70 | 347.10 | 316.60 | 1544.00 |
| Flexural Strength (kpsi) | 3.30 | 4.60 | 11.00 | 8.87 |
| K1c (MPa-$m^{1/2}$) | 0.35 | 0.55 | 1.11 | 9.16 |
| Morphology | single phase | single phase | single phase | — |

These results demonstrate the Tg and fracture toughness that may be obtained by using increased molecular weight PPE in the composition. Conversion of the neat resin into a composite by incorporation of a glass fiber reinforcement and a carbonate filler yield increased the flexural modulus, flexural strength, and fracture toughness, as well as lower coefficients of thermal expansion. Typical unsaturated polyester compositions generally exhibit lower Tg and lower fracture toughness than the above illustrated compositions.

EXAMPLES 5–7

The compositions of Examples 5–7 in Table 4 were prepared in similar manner to those of Example 4. These compositions demonstrate that various acryloyl monomers and mixtures thereof can be used to produce useful cured compositions.

TABLE 4

|  | Ex. 5 | Ex. 6 | Ex. 7 |
|---|---|---|---|
| capped PPE: | | | |
| Prep. Ex. 1 | 42.5 | 42.5 | 42.5 |
| Alkenyl aromatic monomer: | | | |
| Styrene | 42.5 | 42.5 | 37.5 |
| Acryloyl monomer: | | | |
| Trimethylolpropane triacrylate | | | 15 |
| Trimethylolpropane trimethacrylate | 15 | | |
| Bisphenol-A glycerolate (1 E/O) diacrylate | | 15 | |
| Methyl methacrylate | | | 5 |
| Cure Catalyst: | | | |
| t-butylperoxybenzoate | 1 | 1 | 1 |
| Filler: | | | |
| 5 μm $CaCO_3$, (Omyacarb 5, Omya Corporation) | 150 | 150 | 150 |
| Continuous Fiber Glass Mat (OCF 8610) | 108 | 108 | 108 |
| Properties: | | | |
| Tg (° C., DMA) | 191 | 155 | 193 |
| Tg (° C., TMA) | 152 | 129 | 164 |
| CTE below Tg (μm/m-° C.; z-axis direction) | 39 | 42 | 31 |
| CTE above Tg (μm/m-° C.; z-axis direction) | 300 | 346 | 232 |
| CTE below Tg (μm/m-° C.; x-y-axis direction) | — | 21 | 22 |
| CTE above Tg (μm/m-° C.; x-y-axis direction) | — | 72 | 61 |
| Decomposition Onset (° C., TGA, $N_2$) | 433 | 425 | 443 |

These examples show that acryloyl monomers, including methacryloyl monomers, may be incorporated either alone or in combination with other monomers. These results also show that combinations of multifunctional and monofunctional acryloyl monomers may be used with styrene and a capped poly(arylene ether) to form resin that is readily processed in a fluid state by resin transfer molding techniques to yield high temperature composites with good thermal stability upon cure.

EXAMPLES 8–25

Eighteen samples varying in acryloyl monomer type and PPE amount were prepared as in Examples 1–3 and tested using the procedures described above. Compositions and results are given in Table 5. Cyclohexanediol diacrylate was obtained from Sartomer Chemical Company.

TABLE 5

| Ex. No. | Acryloyl monomer Type | Acryloyl monomer (pbw) | 0.25 IV PPE-MAA (pbw) | Styrene (pbw) | t-Butylperoxy Benzoate (pbw) | K1c (MPa-$m^{1/2}$) | Tg (° C.) | CTE below Tg, (μm/m-° C.) | CTE above Tg, (μm/m-° C.) | Dk | Df |
|---|---|---|---|---|---|---|---|---|---|---|---|
| 8 | trimethylolpropane triacrylate | 15 | 20 | 65 | 1 | 0.94 | 127 | 77 | 208 | 4.03 | 0.0029 |
| 9 | trimethylolpropane triacrylate | 15 | 30 | 55 | 1 | 1.25 | 141 | 76 | 248 | 4.13 | 0.0028 |
| 10 | trimethylolpropane triacrylate | 15 | 40 | 45 | 1 | 1.21 | 145 | 72 | 219 | 3.84 | 0.0034 |
| 11 | Neopentyleneglycol diacrylate | 15 | 20 | 65 | 1 | 1.19 | 155 | 77 | 204 | 4.46 | 0.0035 |
| 12 | Neopentyleneglycol diacrylate | 15 | 30 | 55 | 1 | 1.33 | 132 | 65 | 216 | 3.94 | 0.0039 |

TABLE 5-continued

| Ex. No. | Acryloyl monomer Type | Acryloyl monomer (pbw) | 0.25 IV PPE-MAA (pbw) | Styrene (pbw) | t-Butylperoxy Benzoate (pbw) | K1c (MPa-m$^{1/2}$) | Tg (° C.) | CTE below Tg, ($\mu$m/m-° C.) | CTE above Tg, ($\mu$m/m-° C.) | Dk | Df |
|---|---|---|---|---|---|---|---|---|---|---|---|
| 13 | Neopentyleneglycol diacrylate | 15 | 40 | 45 | 1 | 1.04 | 118 | 69 | 223 | 4.2 | 0.0032 |
| 14 | Butanediol diacrylate | 15 | 20 | 65 | 1 | 1.09 | 135 | 73 | 225 | | |
| 15 | Butanediol diacrylate | 15 | 30 | 55 | 1 | 1.25 | 134 | 75 | 204 | 4.12 | 0.0044 |
| 16 | Butanediol diacrylate | 15 | 40 | 45 | 1 | 0.86 | 105 | 84 | 220 | 4.54 | 0.0033 |
| 17 | Hexanediol diacrylate | 15 | 20 | 65 | 1 | 1.02 | 120 | 71 | 220 | 4.06 | 0.0034 |
| 18 | Hexanediol diacrylate | 15 | 30 | 55 | 1 | 1.12 | 129 | 75 | 223 | 3.98 | 0.0039 |
| 19 | Hexanediol diacrylate | 15 | 40 | 45 | 1 | 0.92 | 120 | 87 | 231 | 4.28 | 0.0031 |
| 20 | Cyclohexanedimethanol diacrylate | 15 | 20 | 65 | 1 | 1.04 | 135 | 66 | 229 | 3.98 | 0.003 |
| 21 | Cyclohexanedimethanol diacrylate | 15 | 30 | 55 | 1 | 1.12 | 143 | 68 | 226 | 4.43 | 0.0031 |
| 22 | Cyclohexanedimethanol diacrylate | 15 | 40 | 45 | 1 | 0.92 | 123 | 70 | 216 | 4.12 | 0.0026 |
| 23 | Diethyleneglycol diacrylate | 15 | 20 | 65 | 1 | 1.34 | 169 | 80 | 216 | 4.09 | 0.0044 |
| 24 | Diethyleneglycol diacrylate | 15 | 30 | 55 | 1 | 1.6 | 107 | 88 | 209 | 4.26 | 0.0047 |
| 25 | Diethyleneglycol diacrylate | 15 | 40 | 45 | 1 | 1.16 | 101 | 74 | 229 | 4.39 | 0.0039 |

EXAMPLES 26–40

Twenty-two samples varying in acryloyl monomer type and amount were prepared as follows. The PPE-MAA resin solution of Preparative Example 6 along with the appropriate acryloyl monomer were heated with stirring to produce a homogeneous solution. The solution was then cooled to 70–90° C. and the curing catalyst was added. With vigorous stirring using a high shear mixer, the calcium carbonate was then blended into the solution to form a resin paste. Using a dough mixer obtained from Morton Corporation, this paste was mixed with chopped glass fiber to produce bulk molding compositions. The bulk molding compositions (650 g) were then place in a compression mold with a plaque mold tool and compression molded for 2 minutes at 150° C. under 175,000 psi force. Each sample contained 175 parts calcium carbonate per 100 parts resin, and 20 weight percent chopped fiberglass (PPG 5525, ½ inch length) based on the total weight of the composition. Cyclohexanediol diacrylate and Cyclohexanediol dimethacrylate were obtained from Sartomer Chemical Company. Compositions and results are given in Table 6.

TABLE 6

| Ex. No. | Acryloyl monomer Type | Prep. Ex. 7 PPE-MAA/Styrene, 35% wt/wt Solution (pbw) | Acryloyl monomer (pbw) | t-butyl-peroxy-benzoate (pbw) | Tg (° C.) | CTE below Tg, ($\mu$m/m-° C.) | CTE above Tg, ($\mu$m/m-° C.) | Flexural Strength (kpsi) | Flexural Modulus (kpsi) |
|---|---|---|---|---|---|---|---|---|---|
| 26 | Trimethylolpropane triacrylate | 85 | 15 | 2 | 147 | 37 | 140 | 7.7 | 1450 |
| 27 | Trimethylolpropane trimethacrylate | 85 | 15 | 2 | 153 | 35 | 133 | 11.7 | 1350 |
| 28 | Hexanediol diacrylate | 85 | 15 | 2 | 134 | 39 | 177 | 8.3 | 1400 |
| 29 | Hexanediol dimethacrylate | 85 | 15 | 2 | 140 | 33 | 142 | 9.9 | 1460 |
| 30 | Cyclohexanedimethanol diacrylate | 85 | 15 | 2 | 141 | 33 | 188 | 13.8 | 1480 |
| 31 | Cyclohexanedimethanol dimethacrylate | 85 | 15 | 2 | 149 | 33 | 176 | 15.0 | 1570 |
| 32 | Butanediol diacrylate | 85 | 15 | 2 | 140 | 38 | 160 | 14.1 | 1410 |
| 33 | Butanediol dimethacrylate | 85 | 15 | 2 | 143 | 30 | 132 | 12.5 | 1430 |
| 34 | Neopentylene glycol diacrylate | 85 | 15 | 2 | 138 | 38 | 208 | 10.4 | 1390 |
| 35 | Neopentylene glycol dimethacrylate | 85 | 15 | 2 | 149 | 34 | 158 | 13.4 | 1550 |
| 36 | Diethylene glycol diacrylate | 85 | 15 | 2 | 129 | 39 | 157 | 13.3 | 1170 |
| 37 | Diethylene glycol dimethacrylate | 85 | 15 | 2 | 141 | 33 | 179 | 13.1 | 1510 |
| 38 | None | 100 | 0 | 2 | 134 | 34 | 243 | 13.8 | 1320 |
| 39 | Isobornyl methacrylate | 85 | 15 | 2 | 132 | 29 | 208 | 17.3 | 1410 |
| 40 | Ethyleneglycol dimethacrylate | 85 | 25 | 2 | 146 | 25 | 105 | 10.0 | 1520 |

EXAMPLES 41–45

Four compositions including a rubber impact modifier were prepared. The samples were prepared as in Example 4, with the exception that the rubber impact modifier was added after the acryloyl monomer to the resin solution and blended with vigorous stirring. The materials were tested as described above. The compositions and results are provided in Table 7.

TABLE 7

|  | Ex. 41 | Ex. 42 | Ex. 43 | Ex. 44 | Ex. 45 |
|---|---|---|---|---|---|
| capped PPE: | | | | | |
| Prep. Ex. 1 | 40 | 40 | 40 | | |
| Prep. Ex. 5 | | | | 80 | 80 |
| Alkenyl aromatic monomer: | | | | | |
| Styrene | 40 | 40 | 40 | | |
| Acryloyl monomer: | | | | | |
| Trimethylolpropane triacrylate | 15 | 15 | 15 | 15 | 15 |
| Acryloyl comonomer: | | | | | |
| Methacrylate terminated butadiene-acrylonitrile rubber (VTBN 1300X33; B. F. Goodrich Company) | | 5 | | | |
| Polyurethane Acrylate (CN 965; Sartomer Chemical Company) | | | 5 | | |
| Methacrylate Terminated Polybutadiene (CN 301, Sartomer Chemical Company) | | | | 5 | |
| Methacrylate terminated butadiene-acrylonitrile rubber (VTBN 1300X43; B. F. Goodrich Company) | | | | | 5 |
| Polymeric Additive: | | | | | |
| Polystyrene-Polybutadiene block Copolymer (KRATON ® D 1102; Shell Chemical Company) | 5 | | | | |
| Cure Catalyst: | | | | | |
| t-butylperoxybenzoate | 1 | 1 | 1 | 1 | 1 |
| Filler: | | | | | |
| 5 µm CaCO$_3$ | 150 | 150 | 150 | 150 | 150 |
| Continuous Fiber Glass Mat | 108 | 108 | 108 | 108 | 108 |
| Properties: | | | | | |
| Tg (° C., DMA) | 185 | 176 | 171 | 187 | 185 |
| Tg (° C., TMA) | 157 | 146 | 156 | 158 | 161 |
| CTE < Tg (µm/m-° C.; z-axis direction) | 40 | 30 | 39 | 38 | 32 |
| CTE > Tg (µm/m-° C.; z-axis direction) | 149 | 279 | 245 | 185 | 250 |
| Onset Decomp. (° C., TGA) | 446 | 434 | 433 | 428 | 429 |

These results show that polymeric additives containing reactive acryloyl moieties may be added as comonomers to the acryloyl portion of the resin blend to form curable compositions with excellent thermal stability.

EXAMPLES 46–61

Twenty-five samples were prepared as bulk molding compositions as in Examples 26–40 and molded under identical conditions. Each sample contained 3 parts zinc stearate and 175 parts calcium carbonate per 100 parts resin, and 20 weight percent chopped fiberglass (PPG 5525, ½ inch length) based on the total weight of the composition. The following compositions were prepared as those in Table 6. The materials were tested as described above. The compositions and results are shown in Table 8.

These examples further indicate the scope of the composition as polymeric additives such as butadienes, polystyrene-polybutadiene polystyrene-polyisoprene, hydrogenated versions thereof, and functionalized derivatives thereof can be incorporated. Also demonstrated is the addition of a polymeric acryloyl comonomer to produce curable compositions with good thermal performance and flexural strength, the addition of acrylic compounds to the acryloyl portion of the blend, and the addition of other polymeric additives, as well as compositions prepared with a rubber impact modifier.

TABLE 8

| Ex. No. | Polymeric filler or acryloyl comonomer | 0.25 IV PPE-MAA/Styrene (35% wt./wt.) Solution (pbw) | 0.25 IV PPE-AA/Styrene (35% wt./wt.) Solution (pbw) | 0.12 IV PPE-MAA/Styrene (35% wt./wt.) Solution (pbw) | Neopentyl glycol dimethacrylate (pbw) | Polymeric Filler (pbw) | Additional Styrene (pbw) | MgO (pbw) | Tg (°C) | CTE below Tg (μm/m-°C) | CTE above Tg (μm/m-°C) | Flexural Strength (kpsi) | Flexural Modulus (kpsi) |
|---|---|---|---|---|---|---|---|---|---|---|---|---|---|
| 46 | Polybutadiene dimethacrylate (CN 303, Sartomer Company) | 0 | 0 | 85 | 15 | 15 | 0 | 0 | — | — | — | 11.1 | 1570 |
| 47 | Polybutadiene diacrylate (CN 301 Sartomer Chemical Company) | 0 | 0 | 85 | 15 | 15 | 0 | 0 | 149.43 | 30.9 | 157 | 14.0 | 1220 |
| 48 | Polybutadiene dimethacrylate (CN 303, Sartomer Company) | 85 | 0 | 0 | 21 | 15 | 14 | 0 | 137.32 | 20.1 | 135 | 10.5 | 1240 |
| 49 | Polybutadiene diacrylate (CN 301 Sartomer Chemical Company) | 85 | 0 | 0 | 21 | 15 | 14 | 0 | 144.3 | 30.4 | 137 | 13.3 | 1230 |
| 50 | Carboxylated Polybutadiene dimethacrylate (Hycar BN 2000 X162, B F Goodrich Co.) | 85 | 0 | 0 | 21 | 15 | 14 | 0 | — | — | — | 7.6 | 1050 |
| 51 | Carboxylated polybutadiene (Hycar BN 2000 X162, B F Goodrich Co.) | 0 | 0 | 85 | 21 | 15 | 14 | 1 | — | — | — | 9.43 | 1160 |
| 52 | Carboxylated Poly(butadiene-co-acrylonitrile) (CTBN 1300X31; B. F Goodrich Co.) | 85 | 0 | 0 | 21 | 15 | 14 | 1 | — | — | — | 6.23 | 1152 |
| 53 | KRATON ® FG1901 (linear Poly(styrene)-block-poly(ethylene-butylene) maleic anhydride grafted (30% polystyrene; Shell Chemical Co.) | 85 | 0 | 0 | 21 | 37.5 | 8.5 | 1 | — | — | — | 12.5 | 1300 |
| 54 | KRATON ® FG1901 (linear Poly(styrene)-block-poly(ethylene-butylene) maleic anhydride grafted (30% polystyrene; Shell Chemical Co.) | 0 | 0 | 85 | 21 | 37.5 | 0 | 1 | — | — | — | 13.0 | 1310 |

TABLE 8-continued

| Ex. No. | Polymeric filler or acryloyl comonomer | 0.25 IV PPE-MAA/Styrene (35% wt./wt.) Solution (pbw) | 0.25 IV PPE-AA/Styrene (35% wt./wt.) Solution (pbw) | 0.12 IV PPE-MAA/Styrene (35% wt./wt.) Solution (pbw) | Neopentyl glycol di-methacrylate (pbw) | Polymeric Filler (pbw) | Additional Styrene (pbw) | MgO (pbw) | Tg (° C.) | CTE below Tg (μm/m-° C.) | CTE above Tg (μm/m-° C.) | Flexural Strength (kpsi) | Flexural Modulus (kpsi) |
|---|---|---|---|---|---|---|---|---|---|---|---|---|---|
| 55 | KRATON ® G1780M (linear Poly(styrene)-block-poly(ethylene-butylene), Shell Chemical Co.) | 0 | 0 | 85 | 21 | 37.5 | 0 | 1 | 158.29 | 25.8 | 143 | 10.8 | 1670 |
| 56 | KRATON ® G1652 (linear Poly(styrene)-block-poly(ethylene-butylene), 30% polystyrene, Shell Chemical Co.) | 0 | 0 | 85 | 21 | 37.5 | 0 | 1 | 156.76 | 31.5 | 168 | 9.1 | 1170 |
| 57 | KRATON ® G1657 (linear Poly(styrene)-block-poly(ethylene-butylene), 13% polystyrene, Shell Chemical Co.) | 0 | 0 | 85 | 21 | 37.5 | 0 | 1 | 159.7 | 30.4 | 148 | 9.1 | 1340 |
| 58 | KRATON ® D1161 (linear Poly(styrene)-block-poly(butadiene), Shell Chemical Co.) | 0 | 0 | 85 | 21 | 37.5 | 0 | 1 | — | — | — | 11.8 | 1200 |
| 59 | KRATON ® D1122 (radial Poly(styrene)-block-poly(butadiene), 38% polystyrene, Shell Chemical Co.) | 0 | 0 | 85 | 21 | 37.5 | 0 | 1 | 150.81 | 32.4 | 147 | 10.5 | 1350 |
| 60 | KRATON ® G1726 (linear, Poly(styrene)-block-poly(ethylene-butylene), 30% polystyrene, Shell Chemical Co.) | 0 | 0 | 85 | 21 | 37.5 | 0 | 1 | 156.93 | 26.7 | 153 | 10.1 | 1230 |
| 61 | Maleic Anhydride Functionalized Butadiene (Nippon Petrochemical Co.) | 0 | 0 | 85 | 15 | 15 | 0 | 0 | — | — | — | 1.2 | 1180 |

EXAMPLES 62–70

Eleven samples were prepared with variations in acryloyl comonomers. Each sample contained MAA-capped polyphenylene ether (corresponding to Prep. Ex. 7) and the acryloyl monomer trimethylolpropane triacrylate. Each sample contained 175 parts calcium carbonate per 100 parts resin, and 20 weight percent chopped fiberglass (PPG 5525, ½ inch length) based on the total weight of the composition. Each sample also contained 2 parts by weight of the curing catalyst t-butylperoxybenzoate and 3 parts by weight of the mold release agent zinc stearate. All examples contained 2 parts by weight of the curing catalyst t-butylperoxybenzoate. All examples contained 3 parts by weight of the mold release agent zinc stearate. Sample 64 contained 3 parts by weight zinc stearate and 5 parts by weight zinc acrylate. Samples were molded and tested as described above. Compositions and results are provided in Table 9.

TABLE 9

| Ex. No. | Acrylate Comonomer type | PPE-MAA/Styrene, 35% wt/wt Solution (pbw) | Trimethylolpropane triacrylate Monomer (pbw) | Additional Styrene (pbw) | Comonomer (pbw) | Flexural Strength (kpsi) | Flexural Modulus (kpsi) |
|---|---|---|---|---|---|---|---|
| 62 | Acrylic acid | 80 | 15 | 0 | 5 | 12.2 | 1600 |
| 63 | 2-carboxyethyl acrylate | 80 | 15 | 0 | 5 | 11.8 | 1610 |
| 64 | Zinc acrylate | 80 | 15 | 0 | 5 | 11.0 | 1500 |
| 65 | 3-isopropenyl-alpha,alpha-dimethylmethylbenzylisocyanate | 80 | 15 | 0 | 5 | 9.8 | 1260 |
| 66 | 4-vinylpyridine | 80 | 15 | 0 | 5 | 10.0 | 1290 |
| 67 | 2-vinylpyridine | 80 | 15 | 0 | 5 |  |  |
| 68 | 4-Cyclohexene-1,2-dicarboxylic anhydride | 80 | 15 | 0 | 5 | 10.8 | 1520 |
| 69 | maleic anhydride | 80 | 15 | 0 | 5 | 6.65 | 1438 |
| 70 | Hydroxyethyl methacrylate | 80 | 15 | 0 | 5 | 11.4 | 1.37 |

EXAMPLES 71–75, Comparative Example 1

Five compositions were prepared by resin transfer molding and cured by the techniques described above for Examples 8–25. These examples further demonstrate use of polymeric acryloyl compounds in the composition. Comparative Example 1 included a commercial vinyl ester material and is representative of commercially available vinyl ester resins. The compositions were tested as described above. Compositions and results are provided in Table 10.

TABLE 10

|  | Comp. Ex. 1 | Ex. 71 | Ex. 72 | Ex. 73 | Ex. 74 | Ex. 75 |
|---|---|---|---|---|---|---|
| Vinyl Ester Resin (Momentum M411-350; Dow Chemical Company) | 98 |  |  |  |  |  |
| capped PPE: |  |  |  |  |  |  |
| Prep. Ex. 7 |  | 30 | 26.7 | 29.72 | 29 | 29 |
| Alkenyl aromatic monomer: |  |  |  |  |  |  |
| Styrene |  | 55 | 49 | 42.5 | 42.5 | 52.5 |
| Acryloyl monomer: |  |  |  |  |  |  |
| Trimethylolpropane triacrylate |  | 15 | 13.37 |  |  | 15 |
| Trimethylolpropane trimethacrylate |  |  |  | 16.98 | 17.0 | 17.0 |
| Polybutadiene dimethacrylate (CN 303, Sartomer Chemical Company) |  |  |  | 10.0 | 10.0 | 10.0 |
| Cure Catalyst: |  |  |  |  |  |  |
| t-butylperoxybenzoate | 2 | 0.9 | 0.85 | 1.5 | 1.5 | 2 |
| Properties: |  |  |  |  |  |  |
| Tg (° C., DMA) | 105 | 123 | 120 | 150 | 140 | 135 |
| Fracture Toughness (MPa-m$^{1/2}$) | 0.82 | 0.97 | 2.24 | 1.05 | 1.07 | 0.87 |

These results show that the properties of the inventive compositions have superior balance of thermal and toughness properties compared to commercial vinyl ester materials.

EXAMPLES 76–78

Three filled samples were prepared and tested according to the procedures above. Each sample contained 175 parts calcium carbonate per 100 parts resin, and 20 weight percent chopped fiberglass (PPG 5525, ½ inch length) based on the total weight of the composition. Resin compositions and properties are given in Table 11.

and tested according to the procedures above. Cure times were determined using a Micromet ICAM 2000 cure analyzer and an MP 2000 minipress. A sample was cured in the minipress and the ion mobility measured as a function of time. The cure times reported are the times required for the slope of the log(ion mobility) vs. time curve to equal 1. This corresponded to approximately 95+% conversion. Resin compositions and properties are given in Table 12.

This table shows the importance of blends of styrene and methacrylate to achieve a processable thermosetting resin with optimal properties. In the absence of acryloyl monomer (Ex. 79) the cure rate is excessively long and not useful in commercial applications where high throughput of cured samples is critical. However, addition of moderate amounts of acryloyl monomer enables fast curing rates amenable to commercial applications.

TABLE 11

| Ex. No. | 0.30 IV PPE-MAA/Styrene (35% wt./wt.) Solution (pbw) | 0.25 IV PPE-AA/Styrene (35% wt./wt.) Solution (pbw) | 0.25 IV PPE-PSal/Styrene (35% wt./wt.) Solution (pbw) | Trimethlol propane-triacrylate (pbw) | t-butylperoxy benzoate (pbw) | Tg (° C.) | CTE below Tg ($\mu$m/m-° C.) | CTE above Tg ($\mu$m/m-° C.) | Flexural Strength (kpsi) | Flexural Strength (kpsi) |
|---|---|---|---|---|---|---|---|---|---|---|
| 76 | 85 | 0 | 0 | 15 | 2 | 143.89 | 44.3 | 134 | 7.4 | 1,119 |
| 77 | 0 | 85 | 0 | 15 | 2 | 139.01 | 35.3 | 106 | 7.5 | 1,297 |
| 78 | 0 | 0 | 85 | 15 | 2 | 139.39 | 23.4 | 144 | 6.1 | 1,326 |

EXAMPLES 79–85

These examples illustrate the effect of the ratio of alkenyl aromatic monomer to acryloyl monomer on curing times and glass transition temperatures. Five samples were prepared

TABLE 12

|  | Ex. 79 | Ex. 80 | Ex. 81 | Ex. 82 | Ex. 83 | Ex. 84 | Ex. 85 |
|---|---|---|---|---|---|---|---|
| Capped PPE: |  |  |  |  |  |  |  |
| Prep. Ex. 8 | 21.7 | 21.7 | 21.7 | 21.7 | 21.7 | 21.7 | 21.7 |
| Alkenyl aromatic monomer: |  |  |  |  |  |  |  |
| Styrene | 76.8 | 69.5 | 62.2 | 54.9 | 47.3 | 40.3 | 0 |
| Acryloyl monomer: |  |  |  |  |  |  |  |
| ethylene glycol dimethacrylate | 0 | 7.3 | 14.6 | 21.9 | 29.2 | 36.5 | 76.8 |
| Cure Catalyst: |  |  |  |  |  |  |  |
| t-butylperoxybenzoate | 1.5 | 1.5 | 1.5 | 1.5 | 1.5 | 1.5 | 1.5 |
| Properties: |  |  |  |  |  |  |  |
| Comments | 1 |  |  |  |  |  | 2 |
| Cure time @ 150° C. (sec) | >300 | 91.7 | 78.4 | 68.3 | 76.1 | 54.7 | — |
| Cure time @ 130° C. (sec) | >300 | 168.9 | 144.6 | 111.7 | 90.8 | 70.2 | — |
| Cure time @ 110° C. (sec) | >300 | >300 | >300 | >300 | 256.6 | 214.7 | — |
| Phase Separation Temperature (° C.) | 58 | — | 68 | 73 | — | 116 | — |
| Tg (° C., TMA) | — | 153 | 157 | 155 | 168 | 191 | — |
| CTE ($\mu$m/m > Tg) | — | 27 | 42 | 69 | 64 | 64 | — |
| CTE ($\mu$m/m < Tg) | — | 418 | 260 | 230 | 179 | 138 | — |

Comments:
1. Did Not Cure within 300 seconds
2. Sample Cured while Dissolving PPE in Ethylene Glycol Dimethacrylate
3. NM = not measured

EXAMPLES 86–94

Nine composition were prepared by mixing (1) a 35 weight percent solution in styrene of a methacrylate-capped poly(2,6-dimethyl-1,4-phenylene ether) having an intrinsic viscosity of 0.25 dL/g, (2) an acryloyl monomer selected from trimethylolpropane trimethacrylate or ethoxylated trimethylolpropane trimethacrylate, and (3) t-butyl peroxybenzoate. Amounts, expressed in parts by weight, are given in Table 13. For each mixture, the components were blended at approximately 60–70° C. with vigorous stirring. t-Butylperoxybenzoate was added, and the composition was cooled to room temperature. Each composition was pressure molded into 4-inch diameter by 0.125 inch thick samples in a Tetrahedron compression molding apparatus at 150° C. for six minutes. The resulting parts were cut into test specimens. Fracture toughness (K1) values were measured according to ASTM D5045 with an Instron 1350 load frame and an Instron 8500 Plus control system from notched 0.125×0.5× 2.5 inch samples (no cracks were initiated). Averages and standard deviations were determined from about three to six molded samples for each composition. Glass transition temperatures were measured as previously described. The results, presented in Table 13, show that samples including the alkoxylated acryloyl monomer ethoxylated trimethylolpropane trimethacrylate exhibited substantially higher fracture toughnesses than corresponding samples using trimethylolpropane trimethacrylate.

EXAMPLES 95–100

The procedure described in Examples 86–94 was used to prepare six compositions varying in the identity of the alkoxylated acryloyl monomer. All samples used a 35 weight percent solution in styrene of a methacrylate-capped poly (2,6-dimethyl-1,4-phenylene ether) having an intrinsic viscosity of 0.30. Compositions and results are presented in Table 14. The results show that high fracture strengths were achieved in all samples.

EXAMPLES 101–107

Seven bulk molding compositions were prepared by mixing styrene solutions of methacrylate-capped polyphenylene ethers, acryloyl monomers, (optionally) additional styrene, a maleated polybutadiene thickener (RICON® 131MA5), magnesium oxide, a polybutadiene-polyisoprene block copolymer impact modifier, and zinc stearate at approximately 60–70° C. with vigorous stirring. Calcium carbonate and zinc stearate were added to the mixture, which was blended in a high shear mixer. t-Butylperoxybenzoate was then added, and the composition was poured into a Morton mixing bowl with half-inch glass fiber. After thoroughly dispersing the glass fiber, a 505 g charge of each composition was sealed in polyethylene or nylon film and compression molded at 150° C. for three minutes. Flexural strengths were measured according to ASTM D6272. Flexural elongation was measured according to ASTM D790. Averages and standard deviations were determined from three to six molded samples for each composition. The results, presented in Table 15, demonstrate the preparation of filled and reinforced molding compositions.

TABLE 13

|  | Ex. 86 | Ex. 87 | Ex. 88 | Ex. 89 | Ex. 90 | Ex. 91 | Ex. 92 | Ex. 93 | Ex. 94 |
|---|---|---|---|---|---|---|---|---|---|
| COMPOSITION |  |  |  |  |  |  |  |  |  |
| 35 wt % PPE-MAA in styrene | 60 | 70 | 70 | 75 | 80 | 80 | 85 | 90 | 95 |
| Trimethylolpropane trimethacrylate |  |  | 30 |  |  | 20 |  | 10 | 5 |
| Ethoxylated(9) trimethylolpropane trimethacrylate | 40 | 30 |  | 25 | 20 |  | 15 |  |  |
| t-Butylperoxybenzoate | 2 | 2 | 2 | 2 | 2 | 2 | 2 | 2 | 2 |
| PROPERTIES |  |  |  |  |  |  |  |  |  |
| K1 average (Mpa-m$^{1/2}$) | 2.16 | 3.00 | 0.94 | 3.34 | 3.77 | 0.85 | 4.22 | 1.10 | 1.07 |
| K1 standard deviation (Mpa-m$^{1/2}$), | 0.27 | 0.21 | 0.35 | 0.23 | 0.25 | 0.33 | 0.12 | 0.51 | 0.12 |
| $T_g$ (C) | — | — | 123.6 | 100.6 | 93.9 | 111.5 | — | 98.8 | 106.4 |

TABLE 14

|  | Ex. 95 | Ex. 96 | Ex. 97 | Ex. 98 | Ex. 99 | Ex. 100 |
|---|---|---|---|---|---|---|
| COMPOSITION |  |  |  |  |  |  |
| PPE-MAA in styrene | 80 | 80 | 80 | 80 | 80 | 80 |
| Propoxylated(6) TMPTA | 20 |  |  |  |  |  |
| Propoxylated(3) TMPTA |  | 20 |  |  |  |  |
| Ethoxylated(6) bisphenol-A diacrylate |  |  | 20 |  |  |  |
| Ethoxylated(3) cyclohexanedimethanol diacrylate |  |  |  | 20 |  |  |
| Ethoxylated(4.5) cyclohexanedimethanol diacrylate |  |  |  |  | 20 |  |
| Propoxylated(3) cyclohexanedimethanol diacrylate |  |  |  |  |  | 20 |
| t-Butylperoxybenzoate | 2 | 2 | 2 | 2 | 2 | 2 |
| PROPERTIES |  |  |  |  |  |  |
| K1 average (Mpa-m$^{1/2}$) | 2.20 | 3.88 | 2.15 | 2.45 | 2.60 | 1.75 |
| K1 standard deviation (Mpa-m$^{1/2}$) | 0.45 | 1.01 | 0.39 | 0.25 | 0.65 | 0.09 |

TABLE 15

| | Ex. 101 | Ex. 102 | Ex. 103 | Ex. 104 | Ex. 105 | Ex. 106 | Ex. 107 |
|---|---|---|---|---|---|---|---|
| COMPOSITIONS | | | | | | | |
| 35 wt % 0.30 IV PPE-MAA in styrene Blend | | | 295.3 | 217.5 | | | |
| 35 wt % 0.25 IV PPE-MAA in styrene Blend | | 295.3 | | | 255.9 | 334.6 | 277.8 |
| 42.5 wt % 0.12 IV PPE-MAA in styrene Blend | 295.3 | | | 77.8 | | | |
| Ethoxylated(6) trimethylolpropane triacrylate | 98.4 | 98.4 | 98.4 | 98.4 | 137.8 | 59.1 | 92.6 |
| Styrene | | | | | | | 37.0 |
| Maleated Polybutadiene (Ricon 131MA5) | 78.7 | 78.7 | 78.7 | 78.7 | 78.7 | 78.7 | 37.0 |
| Magnesium Oxide | 7.9 | 7.9 | 7.9 | 7.9 | 7.9 | 7.9 | 3.7 |
| Polybutadiene-Polyisoprene Block Copolymer | | | | | | | 37.0 |
| Zinc Stearate | 11.0 | 11.0 | 11.0 | 11.0 | 11.0 | 11.0 | 11.1 |
| t-butylperoxybenzoate | 7.9 | 7.9 | 7.9 | 7.9 | 7.9 | 7.9 | 7.4 |
| $CaCO_3$ | 100.0 | 100.0 | 100.0 | 100.0 | 100.0 | 100.0 | 100.0 |
| Glass Fiber (Owens-Corning 101C) | 600.0 | 600.0 | 600.0 | 600.0 | 600.0 | 600.0 | 600.0 |
| PROPERTIES | | | | | | | |
| Flex. Strength, average (psi) | 27827 | 19219 | 17985 | 26581 | 23641 | 24021 | 17149 |
| Flex. Strength, std. dev. (psi) | 7234 | 6553 | 5491 | 2728 | 3973 | 2982 | 2465 |
| Flex. Elongation, average (in) | 0.134 | 0.120 | 0.113 | 0.140 | 0.127 | 0.135 | 0.096 |
| Flex. Elongation, std. dev. (in) | 0.016 | 0.037 | 0.039 | 0.006 | 0.018 | 0.003 | 0.004 |

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

All cited patents, patent applications, and other references are incorporated herein by reference in their entirety.

What is claimed is:

1. A curable composition, comprising:
   a functionalized poly(arylene ether);
   an alkenyl aromatic monomer; and
   an alkoxylated acryloyl monomer;
   wherein the functionalized poly(arylene ether) is a capped poly(arylene ether) or a ring-functionalized poly(arylene ether); and
   wherein the capped poly(arylene ether) has the structure $Q(J-K)_y$ wherein Q has the structure

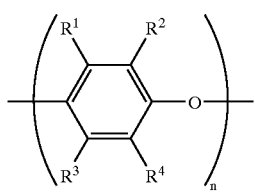

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms; X is hydrogen; and n is 1 to about 100;

y is 1;
   J comprises recurring units having the structure

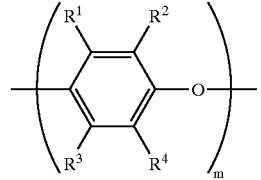

wherein $R^1$–$R^4$ are each independently selected from the group consisting of hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, and $C_2$–$C_{12}$ halohydrocarbonoxy wherein at least two carbon atoms separate the halogen and oxygen atoms; m is 1 to about 200; and K is a capping group selected from the group consisting of

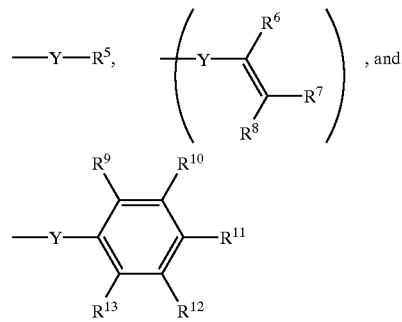

wherein $R^5$ is $C_1$–$C_{12}$ alkyl; $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate; $R^9$–$R^{13}$ are each independently selected from the group consisting of hydrogen, halogen, $C_1$–$C_{12}$ alkyl, hydroxy, and amino; and wherein Y is a divalent group selected from the group consisting of

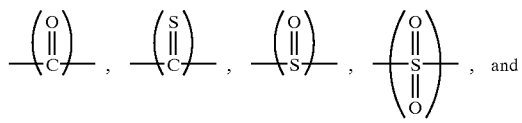, and

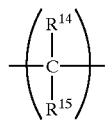

wherein $R^{14}$ and $R^{15}$ are each independently selected from the group consisting of hydrogen and $C_1$–$C_{12}$ alkyl.

2. The composition of claim 1, wherein Q is the residuum of a monohydric phenol.

3. The composition of claim 1, wherein the functionalized poly(arylene ether) is a capped poly(arylene ether), and the capped poly(arylene ether) comprises at least one capping group having the structure

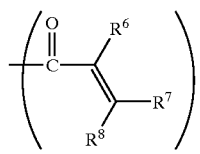

wherein $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate.

4. The composition of claim 1, wherein the functionalized poly(arylene ether) is substantially free of amine substituents.

5. The composition of claim 1, wherein the functionalized poly(arylene ether) has an intrinsic viscosity of about 0.15 to about 0.30 deciliters per gram measured at 25° C. in chloroform.

6. The composition of claim 1, wherein the functionalized poly(arylene ether) is the ring-functionalized poly(arylene ether), and the ring-functionalized poly(arylene ether) comprises repeating structural units having the formula

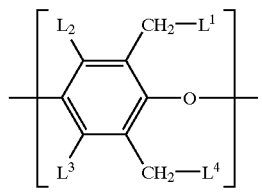

wherein each $L^1$–$L^4$ is independently hydrogen, an alkenyl group, or an alkynyl group; wherein the alkenyl group is represented by

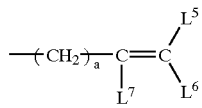

wherein $L^5$–$L^7$ are independently hydrogen or methyl, and a is an integer from 1 to 4; wherein the alkynyl group is represented by

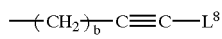

wherein $L^8$ is hydrogen, methyl, or ethyl, and b is an integer from 1 to 4; and wherein about 0.02 mole percent to about 25 mole percent of the total $L^1$–$L^4$ substituents in the ring-functionalized poly(arylene ether) are alkenyl and/or alkynyl groups.

7. The composition of claim 1, comprising about 1 to about 69 parts of the functionalized poly(arylene ether) per 100 parts total of the functionalized poly(arylene ether), the alkenyl aromatic monomer, and the alkoxylated acryloyl monomer.

8. The composition of claim 1, wherein the alkenyl aromatic monomer has the structure

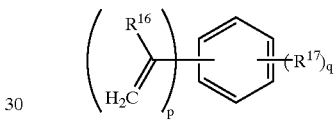

wherein each $R^{16}$ is independently selected from the group consisting of hydrogen and $C_1$–$C_{12}$ alkyl, $C_2$–$C_{12}$ alkenyl, $C_2$–$C_{12}$ alkynyl, and $C_6$–$C_{18}$ aryl; each $R^7$ is independently selected from the group consisting of halogen, $C_1$–$C_{12}$ alkyl, $C_1$–$C_{12}$ alkoxyl, and $C_6$–$C_{18}$ aryl; p is 1 to 4; and q is 0 to 5.

9. The composition of claim 1, wherein the alkenyl aromatic monomer comprises at least one alkenyl aromatic monomer selected from the group consisting of styrene, alpha-methylstyrene, 2-methylstyrene, 3-methylstyrene, 4-methylstyrene, 2-t-butylstyrene, 3-t-butylstyrene, 4-t-butylstyrene, 1,3-divinylbenzene, 1,4-divinylbenzene, 1,3-diisopropenylbenzene, 1,4-diisopropenylbenzene, styrenes having from 1 to 5 halogen substituents on the aromatic ring, and mixtures comprising at least one of the foregoing alkenyl aromatic monomers.

10. The composition of claim 1, comprising about 30 to about 98 parts alkenyl aromatic monomer per 100 parts total of the functionalized poly(arylene ether), the alkenyl aromatic monomer, and the alkoxylated acryloyl monomer.

11. The composition of claim 1, wherein the alkoxylated acryloyl monomer has the structure

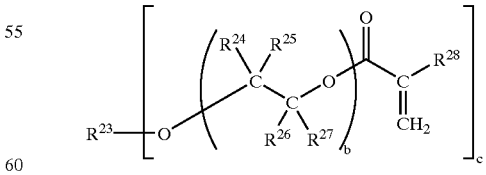

wherein $R^{23}$ is a $C_1$–$C_{250}$ organic group having a valence of c; each occurrence of $R^{24}$–$R^{27}$ is independently hydrogen, $C_1$–$C_6$ alkyl, or $C_6$–$C_{12}$ aryl; each occurrence of b is independently 0 to about 20 with the proviso that at least one occurrence of b is at least 1; each occurrence of $R^{28}$ is independently hydrogen or methyl; and c is 1 to about 10.

12. The composition of claim 11, the alkoxylated acryloyl monomer comprises at least two (meth)acrylate groups.

13. The composition of claim 11, wherein the alkoxylated acryloyl monomer comprises at least three (meth)acrylate groups.

14. The composition of claim 1, wherein the alkoxylated acryloyl monomer is selected from the group, consisting of (ethoxylated)$_{1-20}$ nonylphenol (meth)acrylate, (propoxylated)$_{1-20}$ nonylphenol (meth)acrylate, (ethoxylated)$_{1-20}$ tetrahydrofurfuryl (meth)acrylate, (propoxylated)$_{1-20}$ tetrahydrofurfuryl (meth)acrylate, (ethoxylated)$_{1-20}$ hydroxyethyl (meth)acrylate, (propoxylated)$_{1-20}$ hydroxyethyl (meth)acrylate, (ethoxylated)$_{2-40}$ 1,6-hexanediol di(meth)acrylate, (propoxylated)$_{2-40}$ 1,6-hexanediol di(meth)acrylate, (ethoxylated)$_{2-40}$ 1,4-butanediol di(meth)acrylate, (propoxylated)$_{2-40}$ 1,4-butanediol di(meth)acrylate, (ethoxylated)$_{2-40}$ 1,3-butanediol di(meth)acrylate, (propoxylated)$_{2-40}$ 1,3-butanediol di(meth)acrylate, (ethoxylated)$_{2-40}$ ethylene glycol di(meth)acrylate, (propoxylated)$_{2-40}$ ethylene glycol di(meth)acrylate, (ethoxylated)$_{2-40}$ propylene glycol di(meth)acrylate, (propoxylated)$_{2-40}$ propylene glycol di(meth)acrylate, (ethoxylated)$_{2-40}$ 1,4-cyclohexanedimethanol di(meth)acrylate, (propoxylated)$_{2-40}$ 1,4-cyclohexanedimethanol di(meth)acrylate, (ethoxylated)$_{2-40}$ bisphenol-A di(meth)acrylate, (propoxylated)$_{2-40}$ bisphenol-A di(meth)acrylate, (ethoxylated)$_{3-60}$ glycerol tri(meth)acrylate, (propoxylated)$_{3-60}$ glycerol tri(meth)acrylate, (ethoxylated)$_{3-60}$ trimethylolpropane tri(meth)acrylate, (propoxylated)$_{3-60}$ trimethylolpropane tri(meth)acrylate, (ethoxylated)$_{3-60}$ isocyanurate tri(meth)acrylate, (ethoxylated)$_{3-60}$ isocyanurate tri(meth)acrylate, (ethoxylated)$_{4-80}$ pentaerythritol tetra(meth)acrylate, (propoxylated)$_{4-80}$ pentaerythritol tetra(meth)acrylate, (ethoxylated)$_{6-120}$ dipentaerythritol tetra(meth)acrylate, (propoxylated)$_{6-120}$ dipentaerythritol tetra(meth)acrylate, and combinations comprising at least one of the foregoing alkoxylated acryloyl monomers.

15. The composition of claim 1, wherein the alkoxylated acryloyl monomer is selected from the group consisting of (ethoxylated)$_{3-60}$ trimethylolpropane tri(meth)acrylate, (propoxylated)$_{3-60}$ trimethylolpropane tri(meth)acrylate, (ethoxylated)$_{2-40}$ bisphenol-A di(meth)acrylate, (propoxylated)$_{2-40}$ bisphenol-A di(meth)acrylate, (ethoxylated)$_{2-40}$ cyclohexanedimethanol di(meth)acrylate, (propoxylated)$_{2-40}$ cyclohexanedimethanol di(meth)acrylate, and combinations comprising at least one of the foregoing alkoxylated acryloyl monomers.

16. The composition of claim 1, comprising about ito about 69 parts alkoxylated acryloyl monomer per 100 parts total of the functionalized poly(arylene ether), the alkenyl aromatic monomer, and the alkoxylated acryloyl monomer.

17. The composition of claim 1, further comprising a curing catalyst.

18. The composition of claim 17, wherein the curing catalyst comprises at least one curing catalyst selected from the group consisting of benzoyl peroxide, dicumyl peroxide, methyl ethyl ketone peroxide, lauryl peroxide, cyclohexanone peroxide, t-butyl hydroperoxide, t-butyl benzene hydroperoxide, t-butyl peroctoate, 2,5 -dimethylhexane-2,5-dihydroperoxide, 2,5-dimethyl-2,5-di(t-butylperoxy)hex-3-yne di-t-butylperoxide, t-butylcumyl peroxide, alpha,alpha'-bis(t-butylperoxy-m-isopropyl)benzene, 2,5-dimethyl-2,5-di(t-butylperoxy)hexane, dicumylperoxide, di(t-butylperoxy isophthalate, t-butylperoxybenzoate, 2,2-bis(t-butylperoxy) butane, 2,2-bis(t-butylperoxy)octane, 2,5-dimethyl-2,5-di (benzoylperoxy)hexane, di(trimethylsilyl)peroxide, trimethylsilylphenyltriphenylsilyl peroxide, 2,3-dimethyl-2,3-diphenylbutane, 2,3-trimethylsilyloxy-2,3-diphenylbutane and mixtures comprising at least one of the foregoing curing catalysts.

19. The composition of claim 1, further comprising at least one curing promoter.

20. The composition of claim 19, wherein the curing promoter is selected from the group consisting of cobalt naphthanate, N,N-dimethylaniline, N,N-diethylaniline, and mixtures comprising at least one of the foregoing curing promoters.

21. The composition of claim 1, further comprising a conductive agent.

22. The composition of claim 21, wherein the conductive agent is selected from the group consisting of graphite, conductive carbon black, conductive carbon fibers, metal fibers, metal particles, particles of intrinsically conductive polymers, and combinations comprising at least one of the foregoing conductive agents.

23. The composition of claim 21, wherein the conductive agent comprises graphite.

24. The composition of claim 21, wherein the conductive agent comprises conductive carbon fibers having an average diameter of about 3.5 to about 500 nanometers.

25. The composition of claim 21, comprising about 5 to about 95 weight percent conductive agent, based on the total weight of the composition.

26. The composition of claim 1, further comprising an additive selected from the group consisting of flame retardants, mold release agents and other lubricants, antioxidants, thermal stabilizers, ultraviolet stabilizers, pigments, dyes, colorants, anti-static agents, fillers, fibrous fillers, polymeric fillers, and combinations comprising at least one of the foregoing additives.

27. The composition of claim 1, wherein the composition after curing has a fracture toughness measured according to ASTM D5045 of about 1.5 to 4.22 Mpa-m$^{1/2}$.

28. A curable composition, comprising:

about 1 to about 69 parts by weight of a functionalized poly(arylene ether);

about 30 to about 98 parts by weight of an alkenyl aromatic monomer; and about 1 to about 69 parts by weight of an alkoxylated acryloyl monomer;

wherein the amounts of the functionalized poly(arylene ether), the alkenyl aromatic monomer, and the alkoxylated acryloyl monomer sum to 100 parts by weight; and wherein the functionalized poly(arylene ether) is a capped poly(arylene ether) or a ring-functionalized poly (arylene ether);

wherein the capped poly(arylene ether) has the structure

Q(J—K)$_y$ wherein Q has the structure

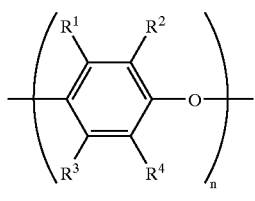

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms; and n is 1 to about 100;

y is 1;

J comprises recurring units having the structure

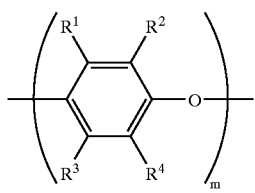

wherein $R^1$–$R^4$ are each independently selected from the group consisting of hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, and $C_2$–$C_{12}$ halohydrocarbonoxy wherein at least two carbon atoms separate the halogen and oxygen atoms; m is 1 to about 200; and K is a capping group selected from the group consisting of

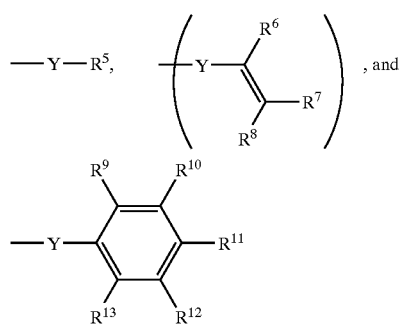

wherein $R^5$ is $C_1$–$C_{12}$ alkyl; $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate; $R^9$–$R^{13}$ are each independently selected from the group consisting of hydrogen, halogen, $C_1$–$C_{12}$ alkyl, hydroxy, and amino; and wherein Y is a divalent group selected from the group consisting of

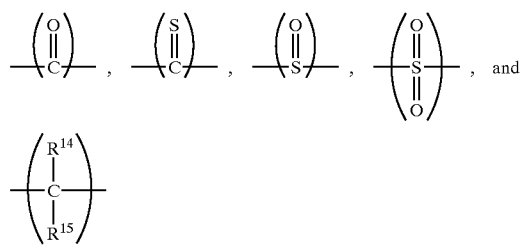

and

wherein $R^{14}$ and $R^{15}$ are each independently selected from the group consisting of hydrogen and $C_1$–$C_{12}$ alkyl.

29. A curable composition, comprising:

about 10 to about 50 parts by weight of a methacrylate-capped poly(arylene ether);

about 40 to about 80 parts by weight of a monofunctional alkenyl aromatic monomer;

about 5 to about 50 parts by weight of a polyfunctional alkoxylated acryloyl monomer; and about 1 to about 5 parts by weight of a curing catalyst;

wherein the methacrylate-capped poly(arylene ether) has the structure $$Q(J\text{—}K)_y$$

wherein Q has the structure

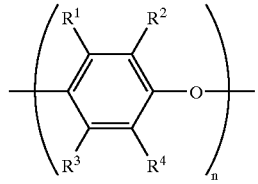

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms; X is hydrogen; and n is 1 to about 100;

y is 1;

J comprises recurring units having the structure

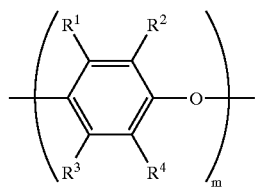

wherein $R^1$–$R^4$ are each independently selected from the group consisting of hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, and $C_2$–$C_{12}$ halohydrocarbonoxy wherein at least two carbon atoms separate the halogen and oxygen atoms; m is 1 to about 200; and K is a capping group having the structure

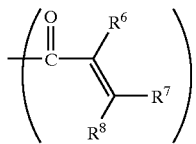

wherein $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_2$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate; and wherein the amounts of the capped poly(arylene ether), the monofunctional alkenyl aromatic monomer, the polyfunctional alkoxylated acryloyl monomer, and the curing catalyst are based on 100 total parts by weight for the methacrylate-capped poly(arylene ether), the monofunctional alkenyl aromatic monomer, and the polyfunctional alkoxylated acryloyl monomer.

30. A curable composition, comprising:

about 10 to about 40 parts by weight of a methacrylate-capped poly(arylene ether);

about 40 to about 70 parts by weight of styrene;

about 10 to about 40 parts by weight of a polyfunctional alkoxylated acryloyl monomer selected from the group consisting of alkoxylated trimethylolpropane tri(meth)acrylate, alkoxylated bisphenol-A di(meth)acrylate, alkoxylated cyclohexanedimethanol di(meth)acrylate, and mixtures thereof; and about 1 to about 5 parts by weight of a curing catalyst;

wherein the methacrylate-capped poly(arylene ether) has the structure

wherein Q has the structure

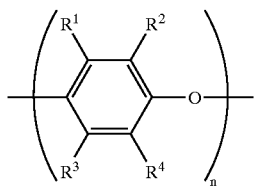

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms; X is hydrogen; and n is 1 to about 100; y is 1;

J comprises recurring units having the structure

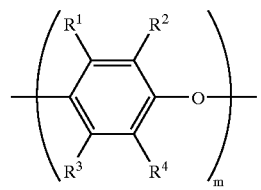

wherein $R^1$–$R^4$ are each independently selected from the group consisting of hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, and $C_2$–$C_{12}$ halohydrocarbonoxy wherein at least two carbon atoms separate the halogen and oxygen atoms; m is 1 to about 200; and K is a capping group having the structure

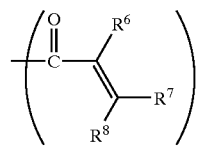

wherein $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate; and wherein the amounts of the methacrylate-capped poly(arylene ether), the styrene, the polyfunctional alkoxylated acryloyl monomer, and the curing catalyst are based on 100 total parts by weight for the methacrylate-capped poly(arylene ether), the styrene, and the polyfunctional alkoxylated acryloyl monomer.

31. A cured composition, comprising the reaction product of:

a functionalized poly(arylene ether);

an alkenyl aromatic monomer; and an alkoxylated acryloyl monomer;

wherein the functionalized poly(arylene ether) is a capped poly(arylene ether) or a ring-functionalized poly(arylene ether);

wherein the capped poly(arylene ether) has the structure

wherein Q has the structure

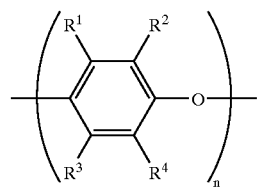

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms; X is hydrogen; and n is 1 to about 100; y is 1;

J comprises recurring units having the structure

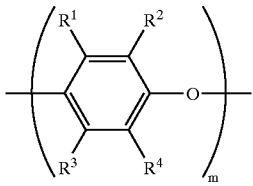

wherein $R^1$–$R^4$ are each independently selected from the group consisting of hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, and $C_2$–$C_{12}$ halohydrocarbonoxy wherein at least two carbon atoms separate the halogen and oxygen atoms; m is 1 to about 200; and K is a capping group selected from the group consisting of

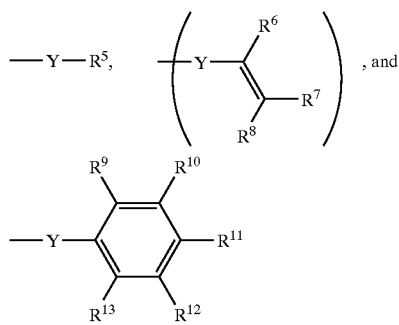

wherein $R^5$ is $C_1$–$C_{12}$ alkyl; $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate; $R^9$–$R^{13}$ are each independently selected from the group consisting of hydrogen, halogen, $C_1$–$C_{12}$ alkyl, hydroxy, and amino; and wherein Y is a divalent group selected from the group consisting of

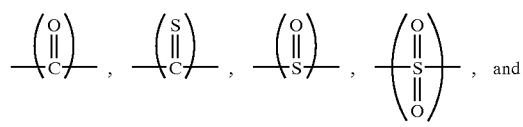

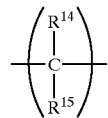

wherein $R^{14}$ and $R^{15}$ are each independently selected from the group consisting of hydrogen and $C_1$–$C_{12}$ alkyl.

32. An article comprising the cured composition of claim 31.

33. A method of preparing a curable composition, comprising: blending a capped poly(arylene ether), an alkenyl aromatic monomer, and an alkoxylated acryloyl monomer to form an intimate blend;

wherein the capped poly(arylene ether) has the structure

wherein Q has the structure

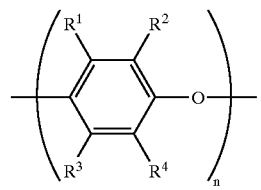

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms; X is hydrogen; and n is 1 to about 100; y is 1;

J comprises recurring units having the structure

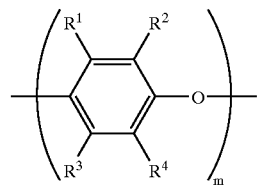

wherein $R^1$–$R^4$ are each independently selected from the group consisting of hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, and $C_2$–$C_{12}$ halohydrocarbonoxy wherein at least two carbon atoms separate the halogen and oxygen atoms; m is 1 to about 200; and K is a capping group selected from the group consisting of

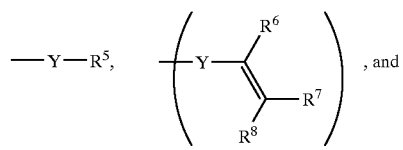

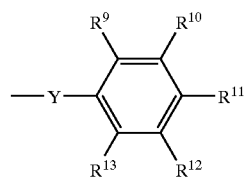

wherein $R^5$ is $C_1$–$C_{12}$ alkyl; $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate; $R^9$–$R^{13}$ are each independently selected from the group consisting of hydrogen, halogen, $C_1$–$C_{12}$ alkyl, hydroxy, and amino; and wherein Y is a divalent group selected from the group consisting of

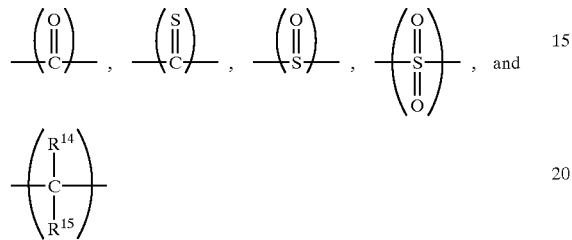

wherein $R^{14}$ and $R^{15}$ are each independently selected from the group consisting of hydrogen and $C_1$–$C_{12}$ alkyl.

34. A curable composition, comprising:

a functionalized poly(arylene ether);

an alkenyl aromatic monomer; and an alkoxylated acryloyl monomer having the structure

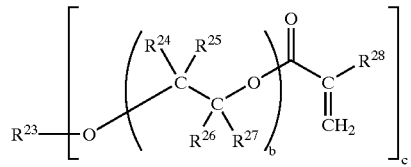

wherein $R^{23}$ is a $C_1$–$C_{250}$ organic group having a valence of c; each occurrence of $R^{24}$–$R^{27}$ is independently hydrogen, $C_1$–$C_6$ alkyl, or $C_6$–$C_{12}$ aryl; each occurrence of b is 3 to about 20; each occurrence of $R^{28}$ is independently hydrogen or methyl; and c is 1 to about 10.

* * * * *

UNITED STATES PATENT AND TRADEMARK OFFICE
CERTIFICATE OF CORRECTION

PATENT NO.     : 6,812,276 B2
APPLICATION NO. : 10/188181
DATED          : November 2, 2004
INVENTOR(S)    : Gary William Yeager It is certified that error appears in the above-identified patent and that said Letters Patent is hereby corrected as shown below:

Title Page,
Item (56) References Cited, U.S. Patent Documents, insert --4,165,422  8/1979  White--.

Column 8,
Line 65, after "either", delete "cis or trans" and insert therefor --*cis* or *trans*--.

Column 9,
Line 48, after "acrylates," delete "such as Epoxy Acrylate".

Column 13,
Line 45, after "J75," delete "CN 966 180" and insert therefor --CN 966 I80--.

Column 15,
Line 41, after "2001", delete "."

Column 17,
Line 31, after "such as" delete "hexamino" and insert therefor --hexaamino--.
Line 61, after "acid", delete "armide", and insert therefor --amide--.

Column 18,
Line 35, after "with", delete "aminosilanes or acryloylsilanes" and insert therefor --aminosilane or acryloylsilane--.

Colume 20,
Line 4, after "various", delete "of".

Colume 23,
Line 29, after "about", delete "-".

Colume 27,
Line 45, after "circuit", delete "boards" and insert therefor --board--.

Colume 28,
Line 4, after "felt-like", delete "resins" and insert therefor --resin--.
Line 65, after "such as", delete "an" and insert therefor --a--.

Colume 30,
Line 49, after "0.15" delete "dL/g" and insert therefor --dl/g--.

UNITED STATES PATENT AND TRADEMARK OFFICE
CERTIFICATE OF CORRECTION

PATENT NO. : 6,812,276 B2
APPLICATION NO. : 10/188181
DATED : November 2, 2004
INVENTOR(S) : Gary William Yeager It is certified that error appears in the above-identified patent and that said Letters Patent is hereby corrected as shown below:

Colume 32,
Line 38, after "compositions", delete "of".

Column 45,
Line 20, Table 11, 5th column, delete "Trimethlolpropanetri-acrylate" and insert therefor --Trimethylolpropanetriacrylate--.

Colume 47,
Line 1, after "Nine", delete "composition" and insert therefor --compositions--.
Line 4, after "0.25", delete "dL/g," and insert therefor --dl/g,--.

Colume 48,
Line 1, after "used a" delete "35weight" and insert therefor --35 weight--.

Colume 49,
Line 52, delete the structure in its entirety and insert therefor
--

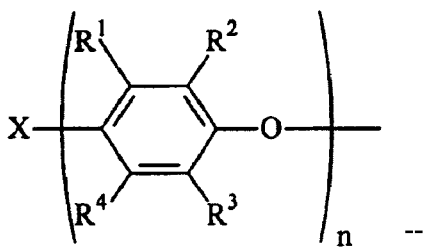

--

Colume 52,
Line 34, after "each" delete "$R^7$" and insert therefor --$R^{17}$--.

Colume 53,
Line 31, after "tri(meth)", delete "acrylate,(ethoxylated)$_{3-60}$" and insert therefor --acrylate, (ethoxylated)$_{3-60}$--.
Line 49, after "about", delete "ito" and insert therefor --1 to--.

Colume 55,
Line 17, after "atoms", insert therefor --X is hydrogen--.

UNITED STATES PATENT AND TRADEMARK OFFICE
CERTIFICATE OF CORRECTION

PATENT NO.       : 6,812,276 B2
APPLICATION NO.  : 10/188181
DATED            : November 2, 2004
INVENTOR(S)      : Gary William Yeager It is certified that error appears in the above-identified patent and that said Letters Patent is hereby corrected as shown below:

Colume 56,
Line 35, delete the structure in its entirety and insert therefor

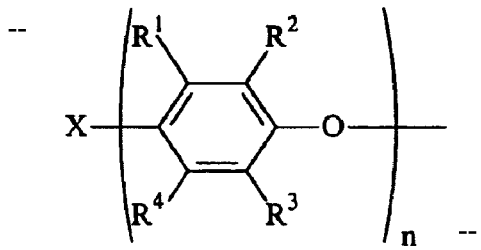

Colume 57,
Line 53, delete the structure in its entirety and insert therefor

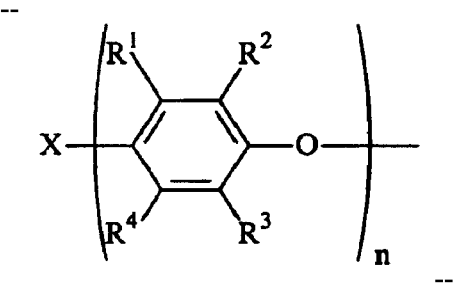

Colume 58,
Line 60, delete the structure in its entirety and insert therefor

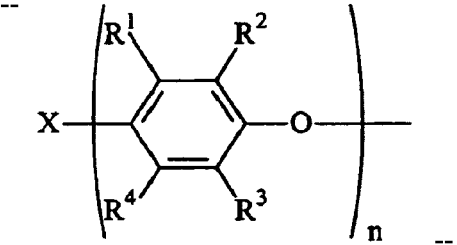

UNITED STATES PATENT AND TRADEMARK OFFICE
CERTIFICATE OF CORRECTION

PATENT NO. : 6,812,276 B2
APPLICATION NO. : 10/188181
DATED : November 2, 2004
INVENTOR(S) : Gary William Yeager It is certified that error appears in the above-identified patent and that said Letters Patent is hereby corrected as shown below:

Colume 60
Line 17, delete the structure in its entirety and insert therefor
--

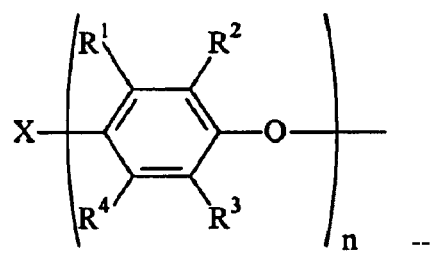

--

Signed and Sealed this

Tenth Day of October, 2006

JON W. DUDAS
*Director of the United States Patent and Trademark Office*